(12) United States Patent
Hashim et al.

(10) Patent No.: US 10,497,682 B2
(45) Date of Patent: Dec. 3, 2019

(54) BACKPLANE LED INTEGRATION AND FUNCTIONALIZATION STRUCTURES

(71) Applicant: Apple Inc., Cupertino, CA (US)

(72) Inventors: Imran Hashim, Saratoga, CA (US); Vaibhav D. Patel, San Jose, CA (US); Hsin-Hua Hu, Los Altos, CA (US); Kapil V. Sakariya, Los Altos, CA (US); Ralph E. Kauffman, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/067,865

(22) PCT Filed: Jan. 11, 2017

(86) PCT No.: PCT/US2017/013050
§ 371 (c)(1),
(2) Date: Jul. 3, 2018

(87) PCT Pub. No.: WO2017/123658
PCT Pub. Date: Jul. 20, 2017

(65) Prior Publication Data
US 2019/0006329 A1 Jan. 3, 2019

Related U.S. Application Data

(60) Provisional application No. 62/277,757, filed on Jan. 12, 2016.

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/44* (2013.01); *H01L 33/486* (2013.01);
(Continued)

(58) Field of Classification Search
CPC ... H01L 25/0753; H01L 33/486; H01L 33/44; H01L 33/62; H01L 33/52;
(Continued)

(56) References Cited

U.S. PATENT DOCUMENTS 6,201,274 B1 * 3/2001 Kanamori ....... H01L 21/823807
257/314
6,215,197 B1 * 4/2001 Iwamatsu ......... H01L 21/76229
257/797

(Continued)

OTHER PUBLICATIONS

PCT International Search Report and Written Opinion for International Application No. PCT/US2017/013050, dated Mar. 31, 2017, 14 pages.

(Continued)

*Primary Examiner* — Victor A Mandala
(74) *Attorney, Agent, or Firm* — Jaffery Watson Mendonsa & Hamilton LLP

(57) ABSTRACT

Display integration schemes are described for passivating LEDs and providing conductive terminal connections. In accordance with embodiments, a sidewall passivation layer is formed around the LEDs. The sidewall passivation layer may or may not be contained within a well structure. A top electrode layer is formed to electrically connect the LEDs to conductive terminal routing.

22 Claims, 35 Drawing Sheets

(51) Int. Cl.
*H01L 33/44* (2010.01)
*H01L 33/48* (2010.01)
*H01L 25/16* (2006.01)
*H01L 33/52* (2010.01)

(52) U.S. Cl.
CPC ............ *H01L 33/62* (2013.01); *H01L 25/167* (2013.01); *H01L 33/52* (2013.01); *H01L 2933/0025* (2013.01); *H01L 2933/0066* (2013.01)

(58) Field of Classification Search
CPC ........... H01L 2933/0025; H01L 25/167; H01L 2933/0066
See application file for complete search history.

(56) References Cited

U.S. PATENT DOCUMENTS

| | | | | |
|---|---|---|---|---|
| 6,660,612 | B1* | 12/2003 | Chang | H01L 21/76229 257/E21.548 |
| 7,265,299 | B2 | 9/2007 | Hu et al. | |
| 7,332,746 | B1 | 2/2008 | Takahashi et al. | |
| 7,825,000 | B2* | 11/2010 | Kanakasabapathy | H01L 23/544 257/422 |
| 7,919,342 | B2 | 4/2011 | Cok | |
| 8,531,642 | B2 | 9/2013 | Kiryuschev et al. | |
| 8,791,474 | B1* | 7/2014 | Bibl | G09G 3/2003 257/100 |
| 9,559,142 | B2* | 1/2017 | Sakariya | H01L 27/124 |
| 9,570,427 | B2* | 2/2017 | Bibl | H01L 33/44 |
| 9,620,487 | B2* | 4/2017 | Sakariya | H01L 25/0753 |
| 2003/0008472 | A1* | 1/2003 | Yoshimura | H01L 21/76264 438/400 |
| 2003/0224260 | A1* | 12/2003 | Ning | G03F 7/70633 430/22 |
| 2004/0043579 | A1* | 3/2004 | Nuetzel | H01L 23/544 438/401 |
| 2004/0102014 | A1* | 5/2004 | Ning | H01L 23/544 438/393 |
| 2005/0101107 | A1* | 5/2005 | Ohto | H01L 23/544 438/462 |
| 2007/0224706 | A1* | 9/2007 | Izumi | H01L 27/11502 438/3 |
| 2012/0061732 | A1* | 3/2012 | Hirai | G11C 13/0007 257/211 |
| 2012/0241786 | A1 | 9/2012 | Odnoblyudov et al. | |
| 2013/0328221 | A1* | 12/2013 | Tsai | H01L 23/544 257/797 |
| 2014/0159043 | A1* | 6/2014 | Sakariya | H01L 27/124 257/59 |
| 2014/0159064 | A1* | 6/2014 | Sakariya | H01L 25/0753 257/88 |
| 2014/0159067 | A1* | 6/2014 | Sakariya | H01L 24/24 257/88 |
| 2014/0367633 | A1* | 12/2014 | Bibl | G02F 1/133603 257/13 |
| 2014/0367705 | A1* | 12/2014 | Bibl | H01L 33/44 257/88 |
| 2015/0084054 | A1* | 3/2015 | Fan | G02F 1/00 257/72 |
| 2015/0115293 | A1* | 4/2015 | Wu | H01L 27/156 257/88 |
| 2015/0177150 | A1 | 6/2015 | Rothberg et al. | |
| 2015/0187740 | A1* | 7/2015 | McGroddy | H01L 25/0753 345/82 |
| 2015/0198761 | A1 | 7/2015 | Wang et al. | |
| 2015/0334845 | A1* | 11/2015 | Niino | H01L 23/26 361/761 |
| 2016/0163765 | A1* | 6/2016 | Hu | H01L 27/156 257/93 |
| 2016/0248002 | A1* | 8/2016 | Lu | H01L 43/02 |
| 2019/0049849 | A1* | 2/2019 | Chen | G03F 7/707 |

OTHER PUBLICATIONS

PCT International Preliminary Report on Patentability for International Application No. PCT/US2017/013050, dated Jul. 26, 2018, 8 pgs.

* cited by examiner

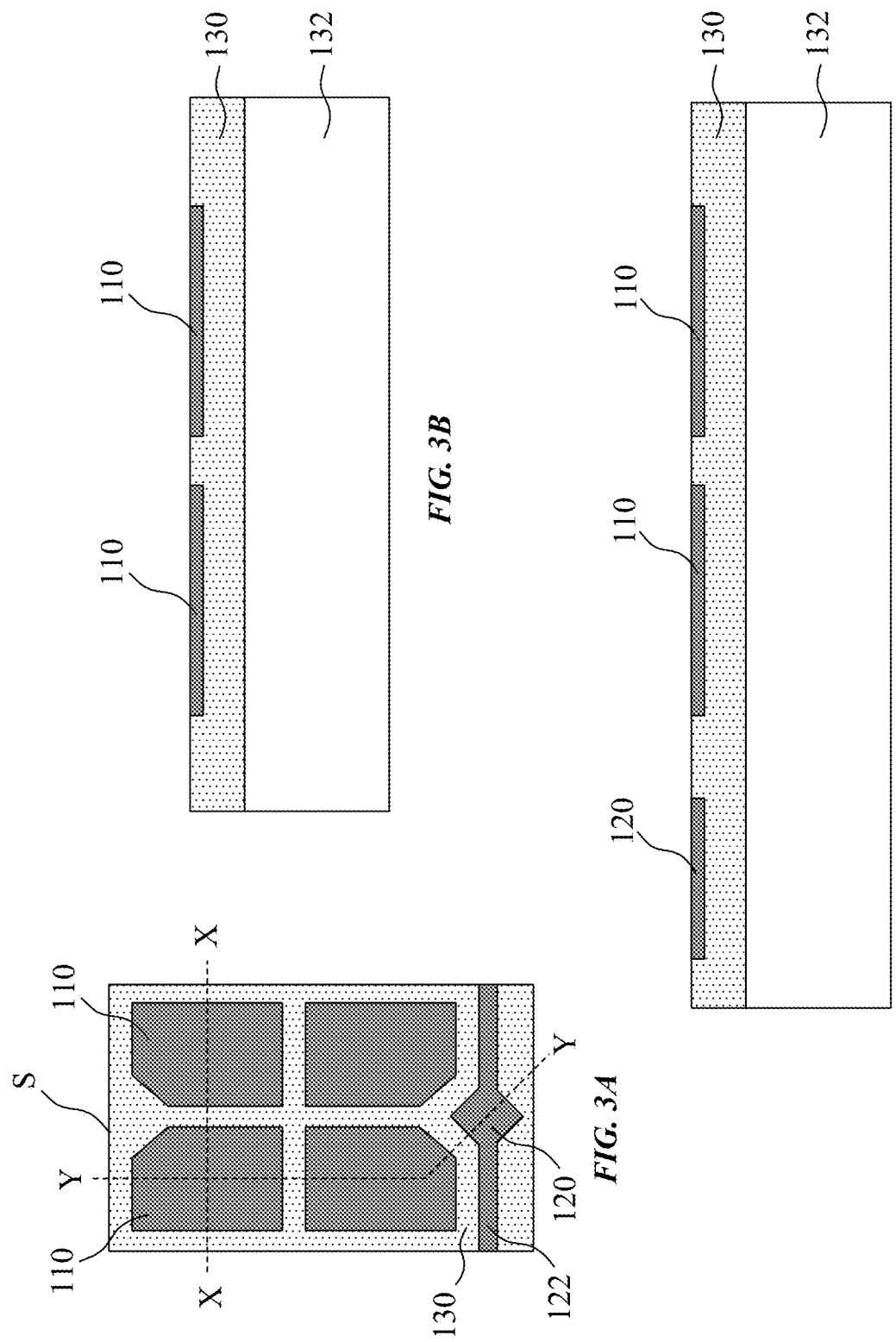

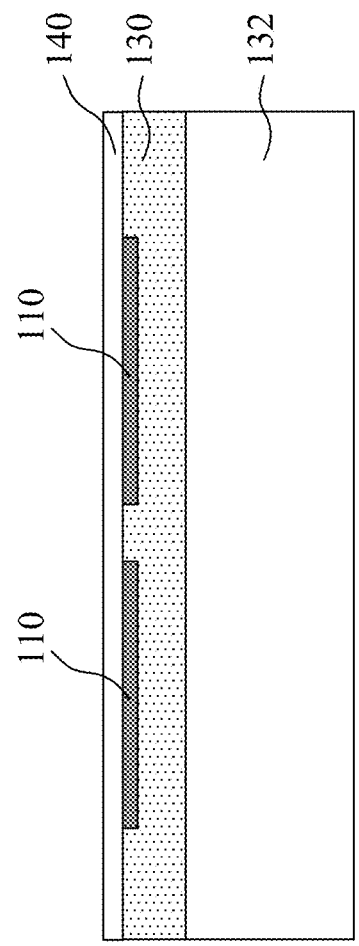
FIG. 4A
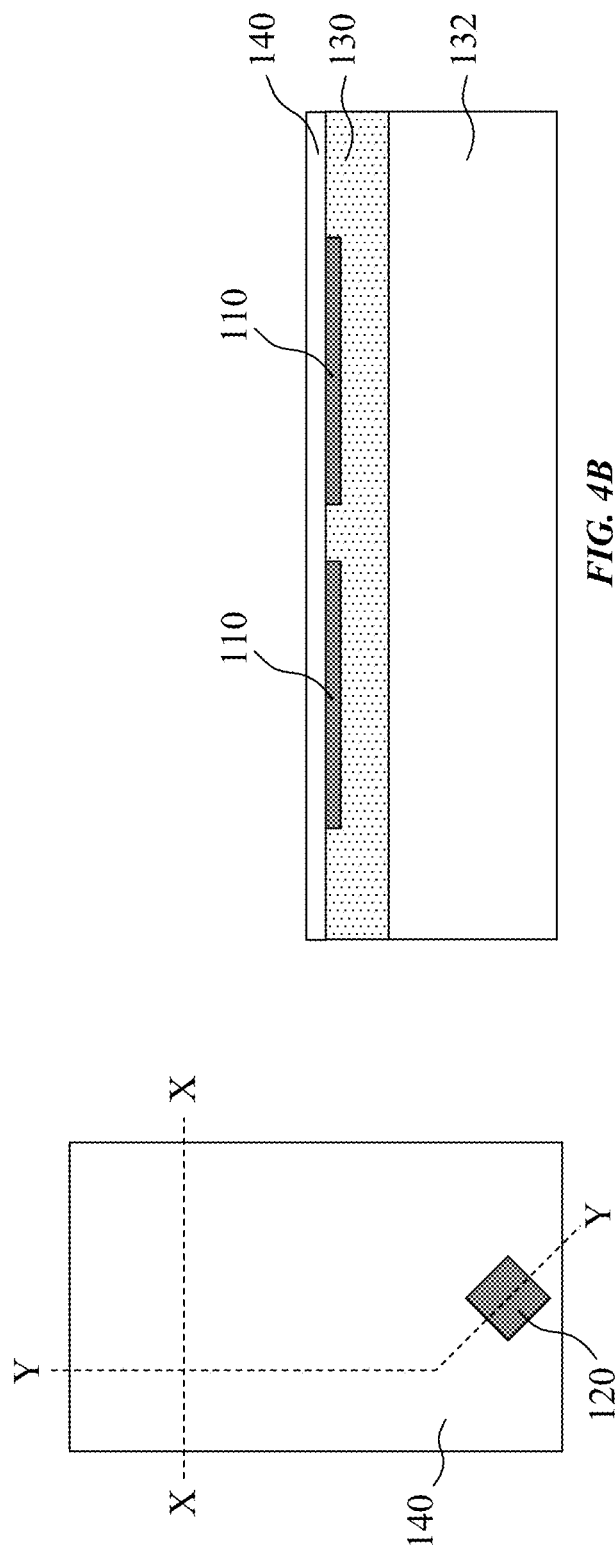
FIG. 4B
FIG. 4C

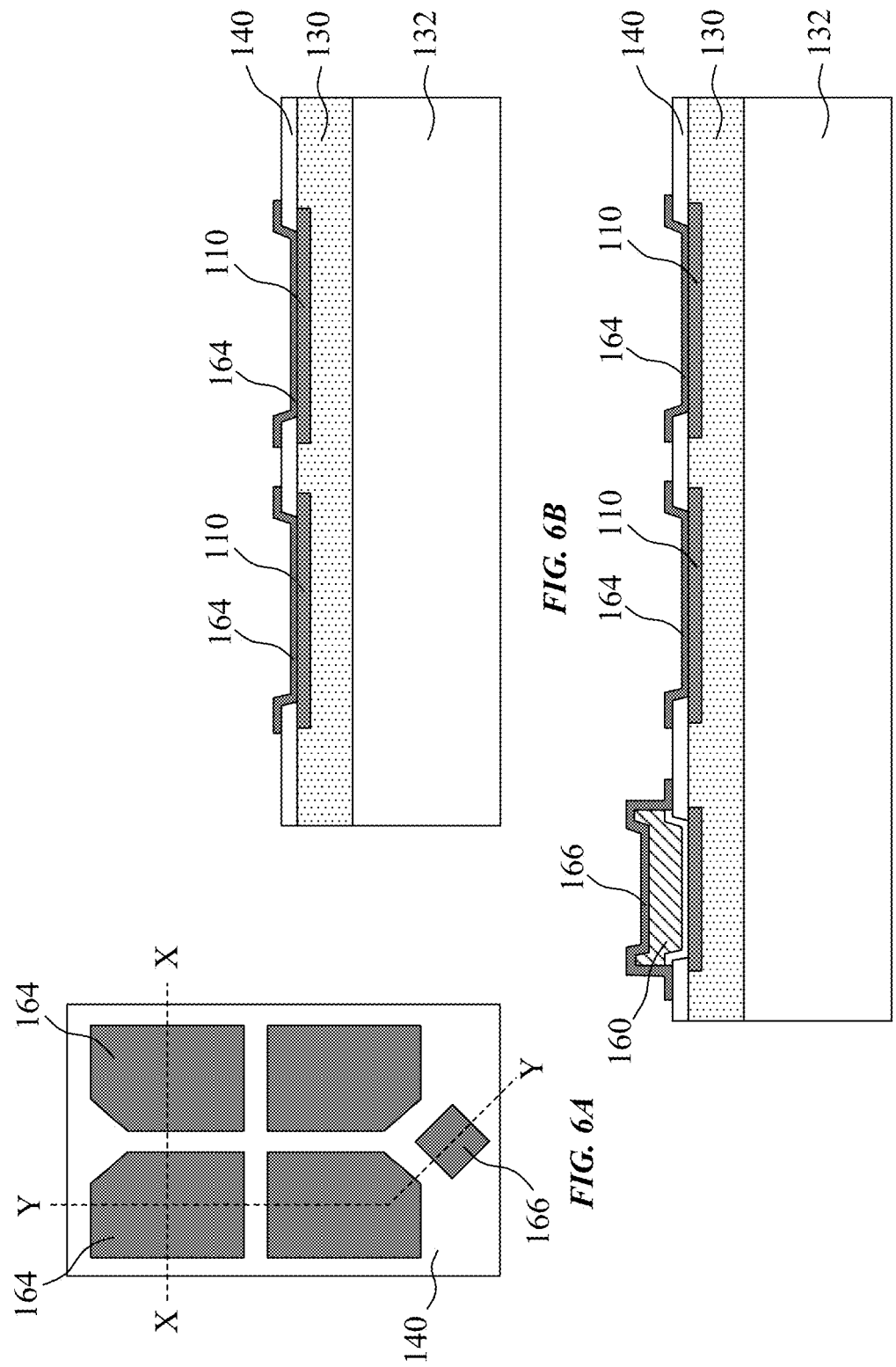

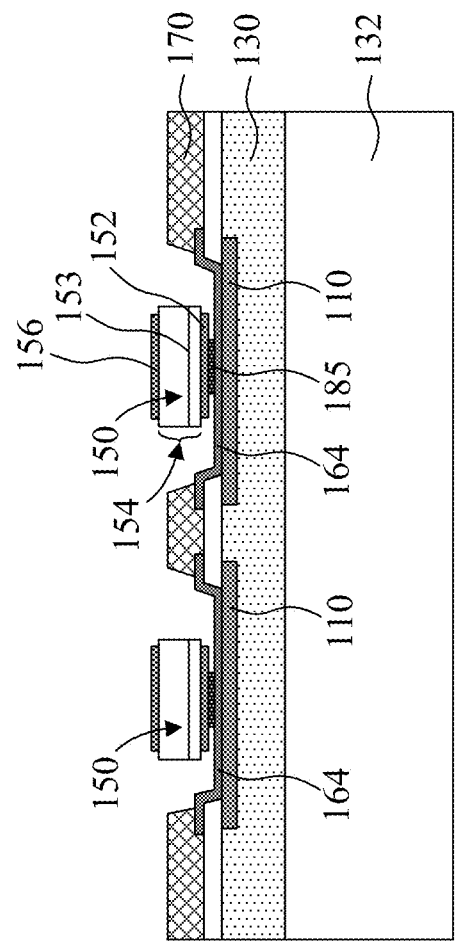
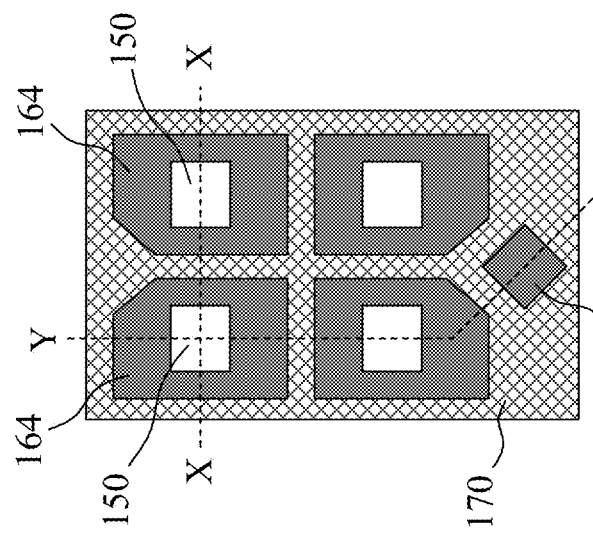
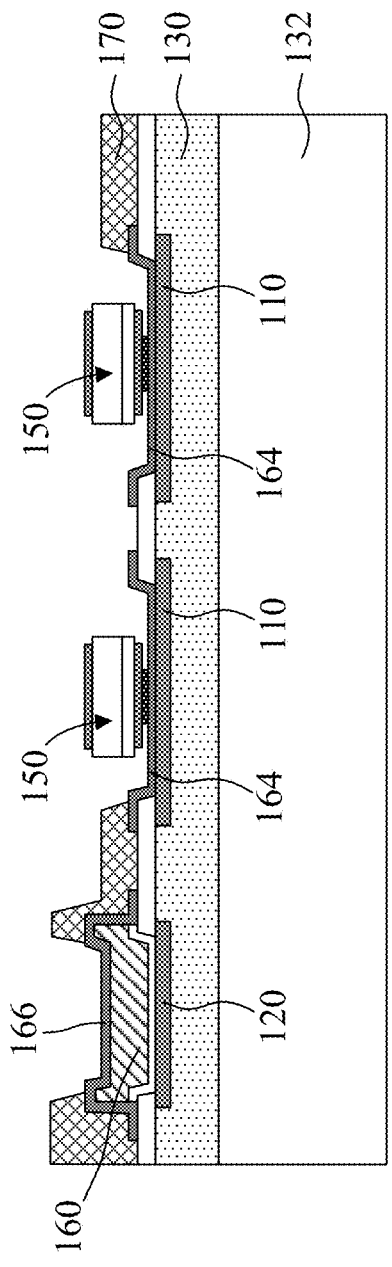
FIG. 11A
FIG. 11B
FIG. 11C

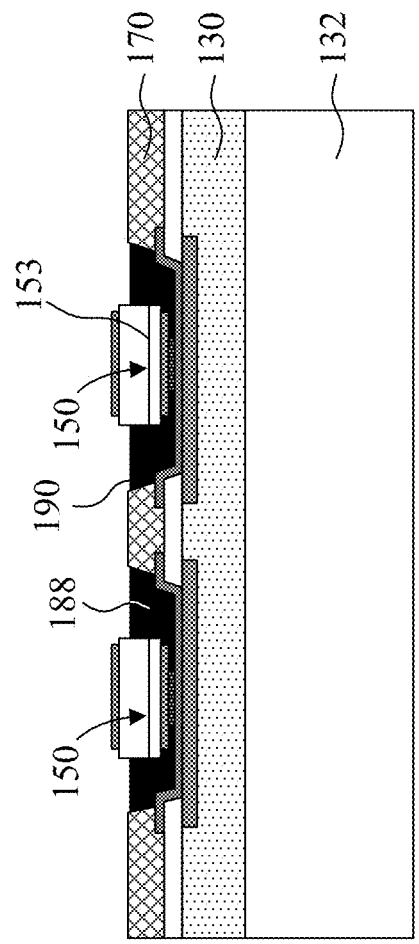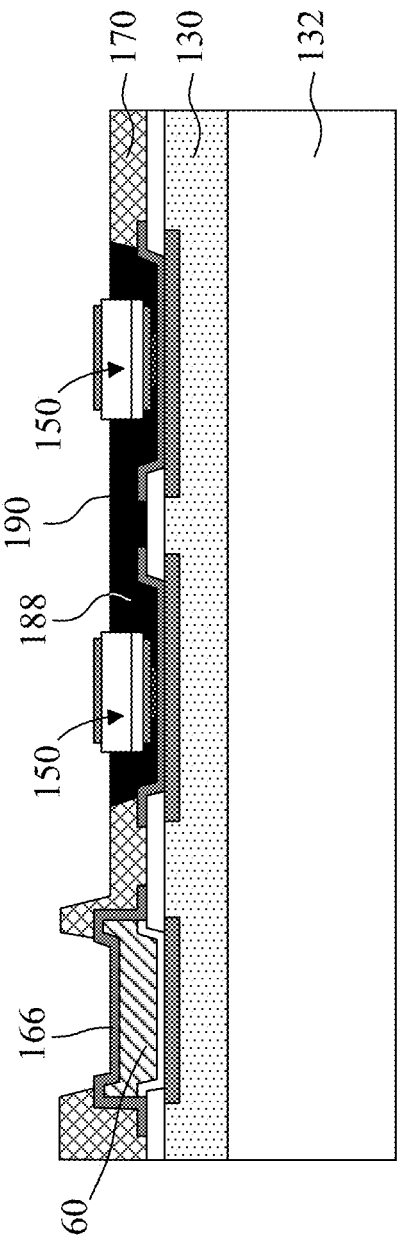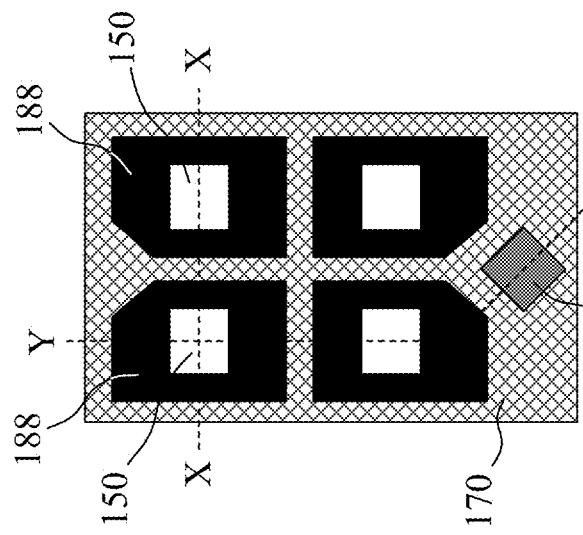
FIG. 12B
FIG. 12C
FIG. 12A

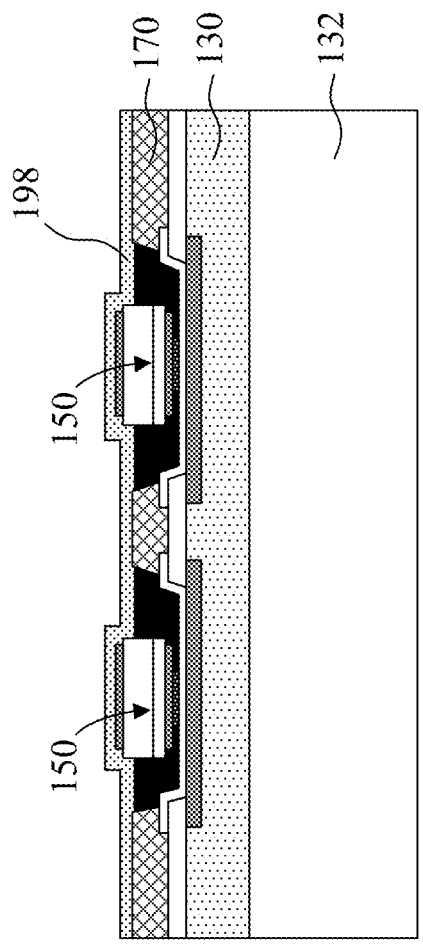
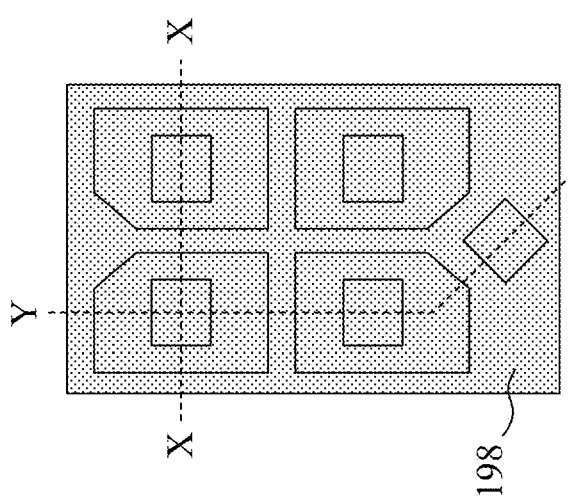
FIG. 13A
FIG. 13B
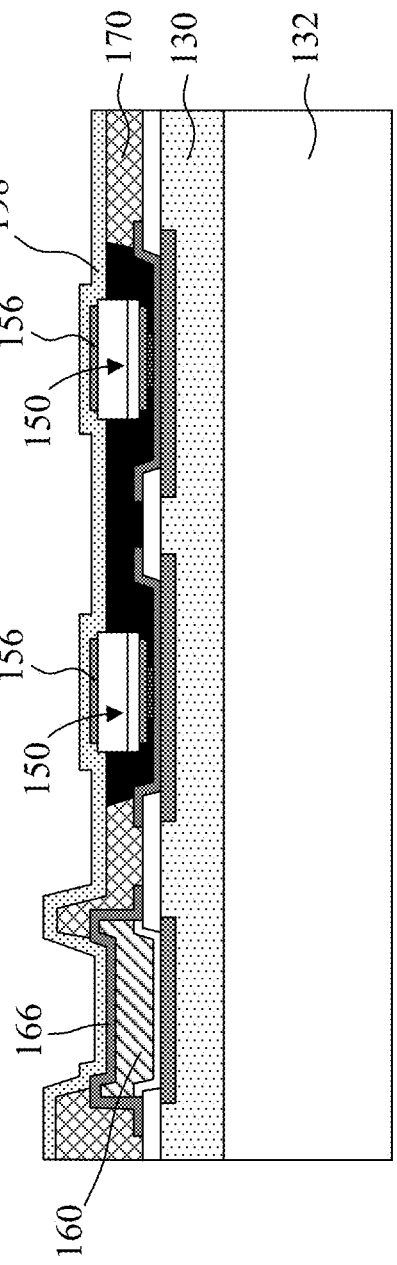
FIG. 13C

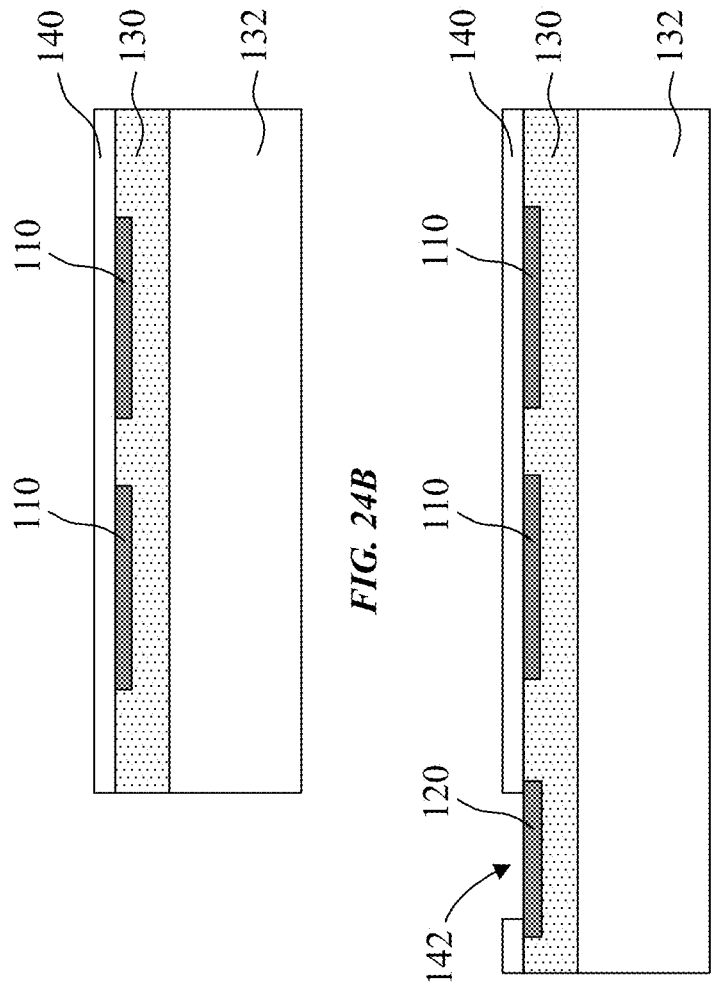
FIG. 24B
FIG. 24C
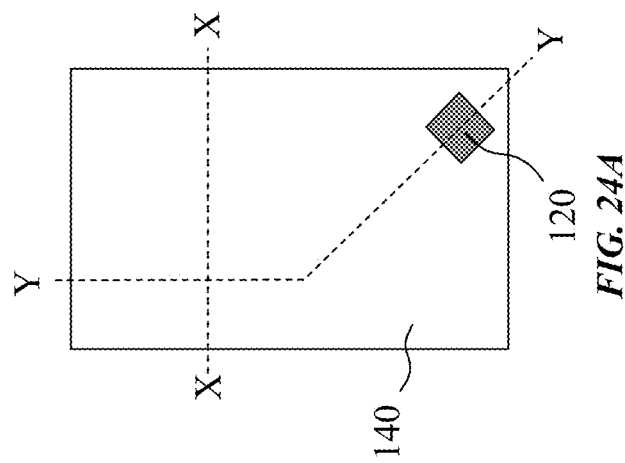
FIG. 24A

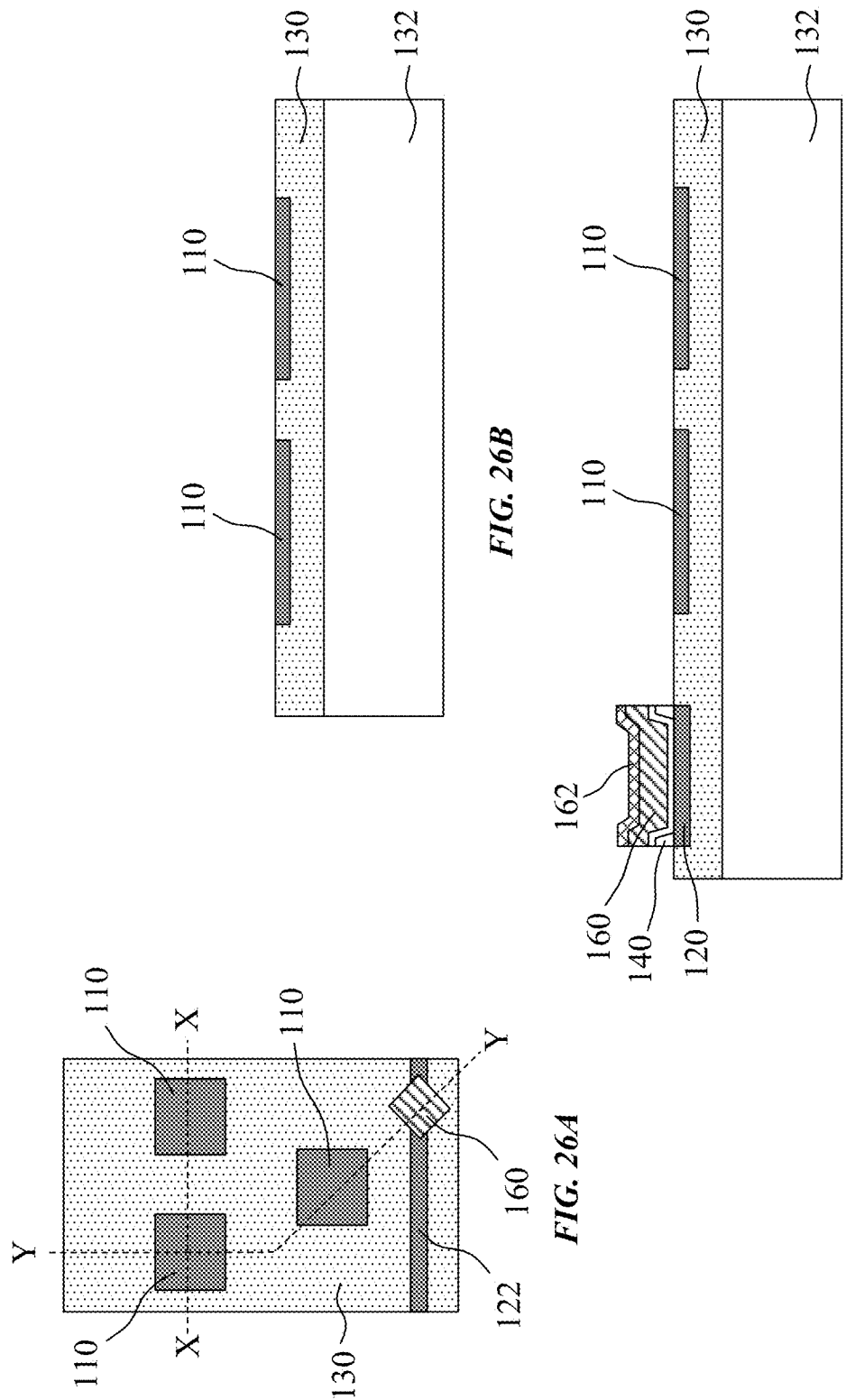

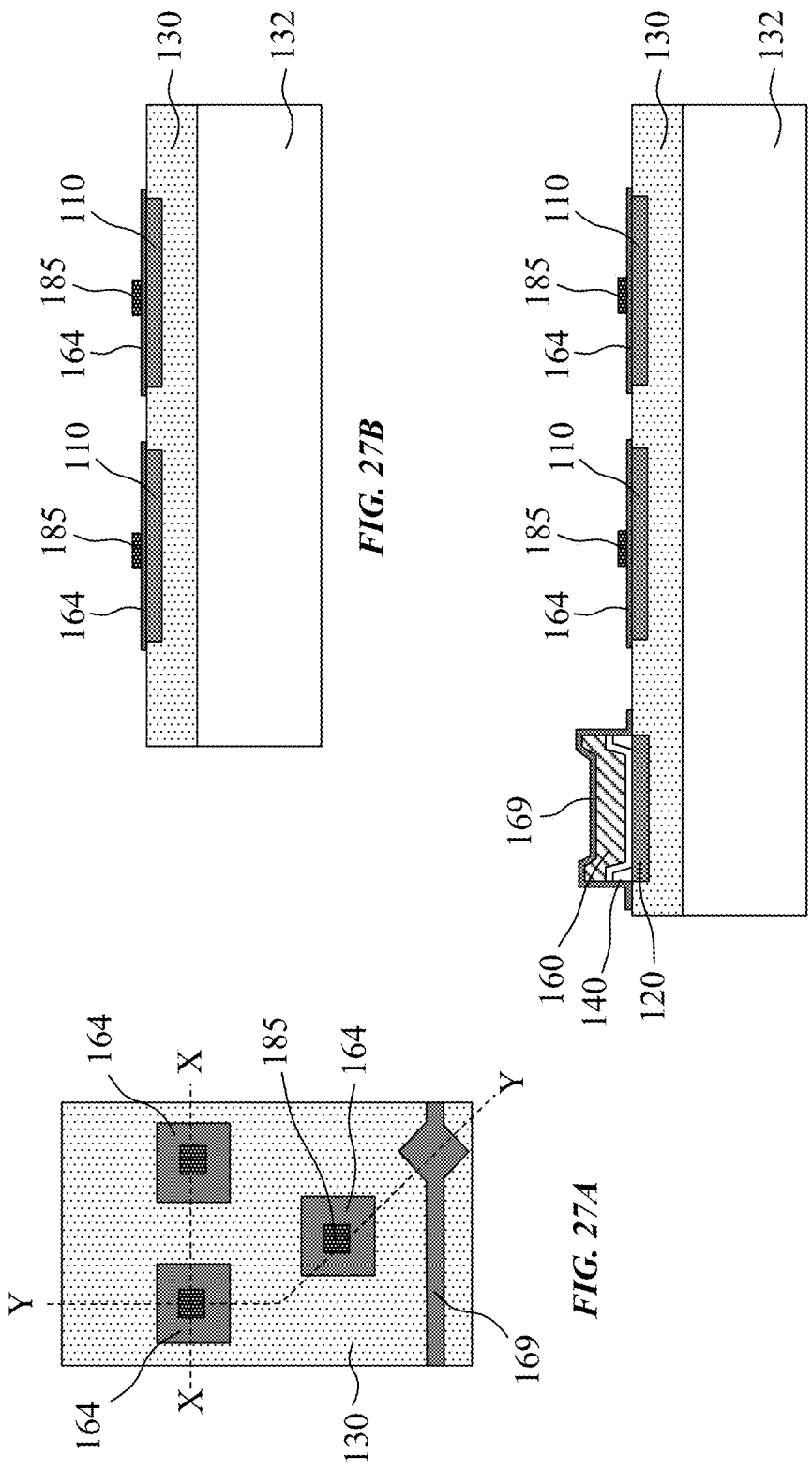

US 10,497,682 B2

BACKPLANE LED INTEGRATION AND FUNCTIONALIZATION STRUCTURES

CROSS-REFERENCE TO RELATED APPLICATIONS

This patent application is a U.S. National Phase Application under 35 U.S.C. § 371 of International Application No. PCT/US2017/013050, filed Jan. 11, 2017, entitled BACKPLANE LED INTEGRATION AND FUNCTIONALIZATION STRUCTURES which claims the benefit of priority of U.S. Provisional Application No. 62/277,757 filed Jan. 12, 2016, both of which are incorporated herein by reference.

BACKGROUND

Field

Embodiments described herein relate to emissive light emitting diodes (LEDs). More particularly, embodiments relate to LED integration and functionalization on a display backplane.

Background Information

State of the art displays for phones, tablets, computers, and televisions utilize glass substrates with thin film transistor (TFTs) to control transmission of backlight though pixels based on liquid crystals. More recently emissive displays such as those based on organic light emitting diodes (OLEDs) have been introduced as being more power efficient, and allowing each pixel to be turned off completely when displaying black. Even more recently, it has been proposed to incorporate emissive inorganic semiconductor-based micro LEDs into high resolution displays. Compared to OLEDs, inorganic semiconductor-based micro LEDs may be more energy efficient and also may not be prone to lifetime degradation and extreme sensitivity to moisture.

SUMMARY

Embodiments describe structures and methods of integrating and electrically connecting LEDs on a display backplane. In particular embodiments describe sidewall passivation and structures for electrically connecting LEDs to conductive terminal, such as a low voltage supply (e.g. Vss) in an exemplary embodiment, though embodiments are not so limited. In one embodiment, an insulating bank layer is formed around the LEDs to form a well structure for a sidewall passivation layer, and a top electrode layer is formed on the LEDs and conductive terminal studs. In one embodiment, conductive terminal sidewalls are formed around the LEDs to form a well structure for the sidewall passivation layer, and a top electrode layer is formed on the LEDs and the conductive terminal sidewalls. In one embodiment, a well structure is not formed, the sidewall passivation layer is formed around the LEDs and conductive terminal studs, and a top electrode layer is formed on the LEDs and the conductive terminal studs. In another embodiment, a well structure is not formed, the sidewall passivation layer is formed around the LEDs, and a top electrode layer is formed on the LEDs and within terminal openings in the passivation layer to contact underlying conductive terminal pads.

BRIEF DESCRIPTION OF THE DRAWINGS

FIG. 3A is a schematic top view illustration of pads and a conductive terminal pad for a subpixel in accordance with an embodiment.

FIG. 3B is a schematic cross-sectional side view illustration taken along line X-X of FIG. 3A in accordance with an embodiment.

FIG. 3C is a schematic cross-sectional side view illustration taken along line Y-Y of FIG. 3A in accordance with an embodiment.

FIGS. 4A-4C are schematic top view and cross-sectional side view illustrations of the formation of a passivation layer and a via opening exposing a conductive terminal pad in accordance with an embodiment, with FIG. 4B taken along line X-X of FIG. 4A and FIG. 4C taken along line Y-Y of FIG. 4A.

FIGS. 6A-6C are schematic top view and cross-sectional side view illustrations of adhesion layers formed on the conductive terminal studs and pads in accordance with an embodiment, with FIG. 6B taken along line X-X of FIG. 6A and FIG. 6C taken along line Y-Y of FIG. 6A.

FIGS. 11A-11C are schematic top view and cross-sectional side view illustrations of LEDs bonded to the pads with the bonding material in accordance with an embodiment, with FIG. 11B taken along line X-X of FIG. 11A and FIG. 11C taken along line Y-Y of FIG. 11A.

FIGS. 12A-12C are schematic top view and cross-sectional side view illustrations of a sidewall passivation layer around the LEDs and within the bank openings in accordance with an embodiment, with FIG. 12B taken along line X-X of FIG. 12A and FIG. 12C taken along line Y-Y of FIG. 12A.

FIGS. 13A-13C are schematic top view and cross-sectional side view illustrations of a top electrode layer on the LEDs and the conductive terminal studs in accordance with an embodiment, with FIG. 13B taken along line X-X of FIG. 13A and FIG. 13C taken along line Y-Y of FIG. 13A.

FIGS. 24A-24C are schematic top view and cross-sectional side view illustrations of the formation of a passivation layer and a via opening exposing a conductive terminal pad in accordance with an embodiment, with FIG. 24B taken along line X-X of FIG. 24A and FIG. 24C taken along line Y-Y of FIG. 24A.

FIGS. 26A-26C are schematic top view and cross-sectional side view illustrations of the passivation layer removed from the pads in accordance with an embodiment, with FIG. 26B taken along line X-X of FIG. 26A and FIG. 26C taken along line Y-Y of FIG. 26A.

FIGS. 27A-27C are schematic top view and cross-sectional side view illustrations of a patterned adhesion layer formed over the conductive terminal studs and pads and bonding material formed on the pads in accordance with an embodiment, with FIG. 27B taken along line X-X of FIG. 27A and FIG. 27C taken along line Y-Y of FIG. 27A.

DETAILED DESCRIPTION

Figure 1:
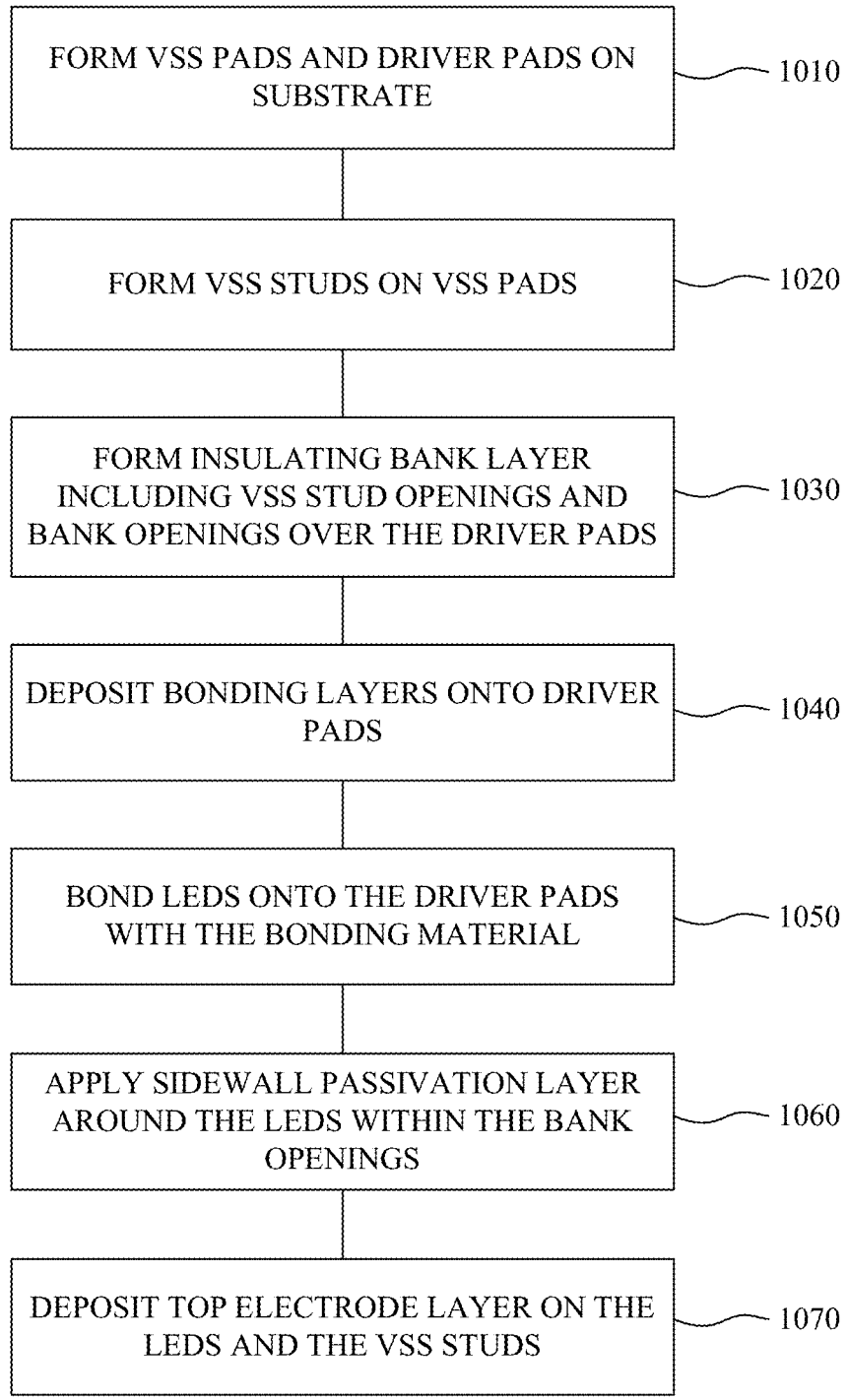
FIG. 1 is a flow chart illustrating a method of electrically connecting LEDs with conductive terminal studs in accordance with an embodiment.

Embodiments describe various methods and structures for integrating and functionalizing LEDs on a display backplane. In particular, embodiments are related to the integration and functionalization of micro LEDs. In accordance with embodiments, the micro LEDs may be formed of inorganic semiconductor-based materials, and have maximum lateral dimensions between sidewalls of 1 to 300 µm, 1 to 100 µm, 1 to 20 µm, or more specifically 1 to 10 µm, such as 5 µm. In accordance with embodiments, the LEDs, or micro LEDs, may be vertical LEDs, including a bottom conductive contact bonded to a pad (e.g conductive driver contact pad) on the display backplane, and a top conductive contact that is electrically connected with a conductive terminal structure by a top electrode layer. In one aspect, embodiments describe various integration and functionalization schemes for vertical LEDs that can be implemented in high resolution displays.

In another aspect, embodiments describe various integration and functionalization schemes that allow for a signal from the conductive terminal structure to be uniformly distributed to an array of LEDs on the backplane, thereby providing more uniform light emission across the panel. For example, the conductive terminal structure and signal may be a ground plane or some other low voltage (Vss) or reverse bias, power supply plane or some other high voltage level (Vdd), current source output, or voltage source output. In another aspect, the arrangement of conductive terminal structures enables reduction of power consumption of the display panel by reducing contact resistance in the electrical path from LED to low voltage line, where the distance of the electrical path through the top electrode layer is reduced by connecting the top electrode layer to a conductive terminal structure of higher electrical conductivity than the top electrode layer.

In accordance with embodiments the display backplanes may be TFT backplanes fabricated using technologies such as include polycrystalline silicon (poly-Si) and amorphous silicon (a-Si). The display backplanes may include a single crystal active layer. In such a configuration, the pixel circuits may be fabricated using MOSFET processing techniques. The backplanes may be active matrix or passive matrix. The display backplanes may be rigid or flexible. In some embodiments the display backplanes may include redistribution lines, and the pixel circuits may be included in driver chips that are also bonded to or embedded within the backplane.

In accordance with embodiments the LEDs may be fabricated using different II-VI or MN inorganic semiconductor-based systems. For example, blue or green emitting LEDs may be fabricated using inorganic semiconductor materials such as, but not limited to, GaN, AlGaN, InGaN, AlN, InAlN, AlInGaN, ZnSe. For example, red emitting LEDs may be fabricated using inorganic semiconductor materials such as, but not limited to, GaP, AlP, AlGaP, AlAs, AlGaAs, AlInGaP, AlGaAsP, and any As—P—Al—Ga—In.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning", and "on" as used herein may refer to a relative position of one layer with respect to other layers. One layer "above", "over", "spanning", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a flow chart is provided illustrating a method of electrically connecting LEDs with conductive terminal studs in accordance with an embodiment. In interest of clarity, the following description of FIG. 1 is made with regard to reference features found in other figures described herein. At operation 1010 an array of conductive terminal pads 120 and an array of pads 110 (e.g. conductive driver contact pads) are formed on a substrate. At operation 1020 an array of conductive terminal studs 160 is formed on the array of conductive terminal pads 120. At operation 1030 an insulating bank layer 170 is then formed over the substrate including an array of terminal stud openings 176 and an array of bank openings 174 over the pads 110. Bonding layers 185 may be deposited onto the exposed pads 110 at operation 1040, followed by bonding an array of LEDs 150 to the array of pads 110 with the bonding layers 185 at operation 1050. At operation 1060 a sidewall passivation layer 188 is applied around the LEDs 150 and within the bank openings 174. A top electrode layer 198 is then deposited on the LEDs 150 and the conductive terminal studs 160 at operation 1070.

Figure 2:
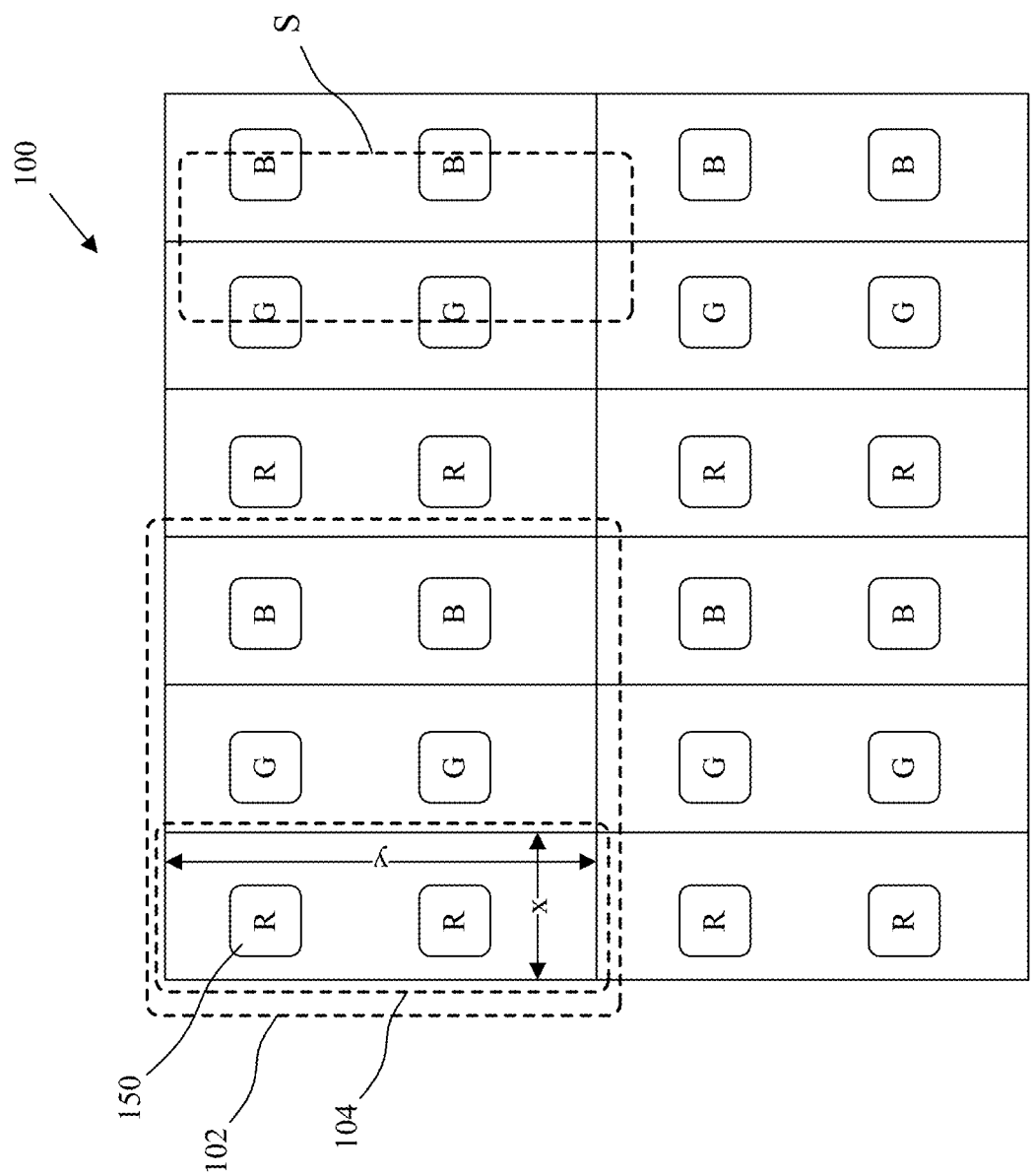
FIG. 2 is a schematic top view illustration of an arrangement of pixels in accordance with an embodiment.

FIG. 2 is a schematic top view illustration of an arrangement of pixels 102 in accordance with an embodiment. By way of example, each subpixel 104 may be characterized by a horizontal dimension (x) and vertical dimension (y). In the particular embodiment illustrated in FIG. 2, an exemplary red-green-blue (RGB) display pixel layout is provided, for example, that may be compatible with 1920×1080 or 2560× 1600 resolutions. In the particular embodiment illustrated, each pixel 102 includes a red emitting subpixel 104, a green emitting subpixel 104, and a blue emitting subpixel 104. However, the specific resolution and RGB color scheme is for illustrational purposes only, and embodiments are not so limited. Other exemplary pixel arrangements include red-green-blue-yellow-cyan (RBGYC), red-green-blue-white (RGBW), or other sub-pixel matrix schemes where the pixels have a different number of sub-pixels. Each subpixel 104 may optionally include a redundant pair of LEDs 150, which may be bonded to separately addressable pads. Redundancy may optionally be included where space is available to resolve potential display defects in the event of a defective or mis-transferred LED 150.

FIG. 3A is a schematic top view illustration of pads 110 and a conductive terminal pad 120 for a subpixel in accordance with an embodiment. The particular sub-section taken in FIG. 3A is along section-S illustrated in FIG. 2. FIG. 3B is a schematic cross-sectional side view illustration taken along line X-X of FIG. 3A in accordance with an embodiment. FIG. 3C is a schematic cross-sectional side view illustration taken along line Y-Y of FIG. 3A in accordance with an embodiment.

Referring to FIGS. 3A-3C, a top metal layer may be patterned to form pads 110, and conductive terminal pads 120 along conductive terminal lines 122. For example, the top metal layer may be included in a build-up structure 130 which may include one or more metallization layers and interlayer dielectric layers. For purposes of illustration only, build-up structure 130 is illustrated herein as including a planar top surface including pads 110, conductive terminal pads 120, and optionally conductive terminal lines 122 embedded in a single dielectric layer. The build-up structure 130 may be formed on or as a part of substrate 132. In accordance with embodiments the substrate 132 may be rigid or flexible. Substrate 132, and optionally build-up structure 130, may include functional devices, such as TFT circuitry. In an embodiment substrate 132 may be polycrystalline silicon (poly-Si) or amorphous silicon (a-Si). The substrate may include a single crystal (e.g. Si) active layer. In such a configuration, the pixel circuits may be fabricated using MOSFET processing techniques. The backplanes 100 may be active matrix or passive matrix.

Referring now to FIGS. 4A-4C, a passivation layer 140 is formed over the substrate 132, and patterned to form openings 142 over the conductive terminal pads 120. As shown, the passivation layer 140 covers the pads 110. The passivation layer 140 may be a single layer or multiple layers. In an embodiment, the passivation layer 140 is a SiN/SiO$_2$ multilayer stack.

Figure 5B:
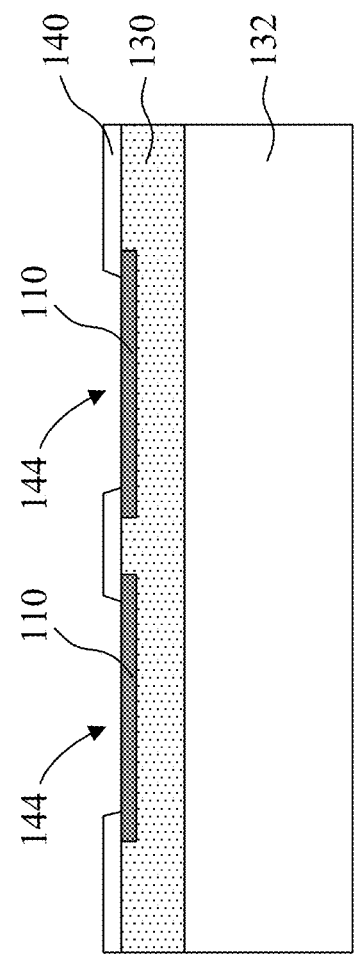
FIGS. 5A-5C are schematic top view and cross-sectional side view illustrations of conductive terminal studs formed on conductive terminal pads and exposed pads in accordance with an embodiment, with FIG. 5B taken along line X-X of FIG. 5A and FIG. 5C taken along line Y-Y of FIG. 5A.
Figure 5A:
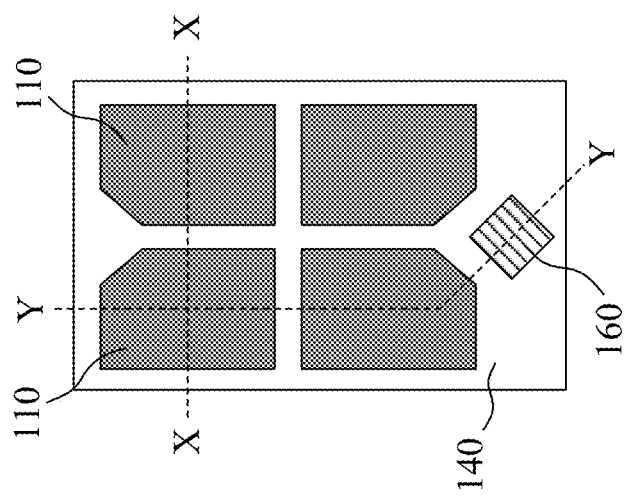
Figure 5C:
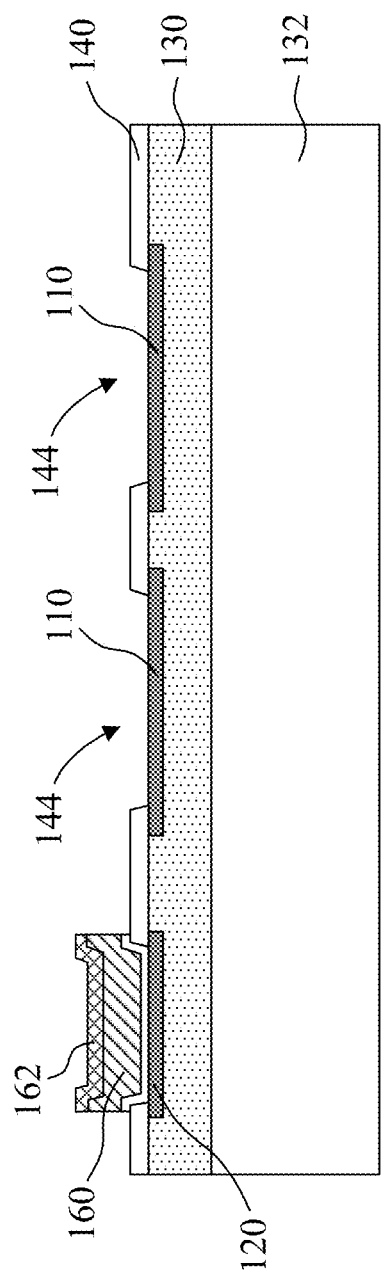

Referring now to FIGS. 5A-5C, a metal layer (e.g. Aluminum) is deposited over the passivation layer 140 and patterned to form conductive terminal studs 160. The metal layer thickness may be chosen to match the height of the LEDs that are subsequently bonded to the backplane. In an embodiment, the conductive terminal studs 160 are approximately 2.5-3.0 μm tall. In the embodiment illustrated in FIG. 5C, the conductive terminal studs 160 are covered with a hard mask 162, such as SiN, to protect the conductive terminal studs 160 during subsequent processing operations. Still referring to FIGS. 5A-5C, the passivation layer 140 may be patterned to form openings 144 over the pads 110. Subsequently, the hard mask 162 may be removed by a blanket etch.

A patterned adhesion layer may then be formed including pad adhesion layers 164 over the pads 110 and conductive terminal stud adhesion layers 166 over the conductive terminal studs 160 as illustrated in FIGS. 6A-6C. In an embodiment, patterned adhesion layer (including conductive terminal stud adhesion layers 166 and pad adhesion layers 164) is formed of TaN. For example, the patterned adhesion layer may be 0.2 μm thick. As will become apparent in the following description, in addition to functioning as an adhesion layer, the patterned adhesion layer may function as a barrier layer for the indium posts that will subsequently be formed. Indium, being a low melting point (156° C.) solid readily diffuses into copper, which may be used as the pads 110. A TaN adhesion layer may inhibit In from diffusing into the underlying copper interconnects/ pads, as well as provide for ohmic contact between the pads 110 and the bottom contacts of the LEDs. The adhesion layer may additionally function to provide an oxidation resistant barrier for the conductive terminal structures, and assist in providing ohmic contact with the top electrode layer (e.g. ITO).

Figures 7A, 7B, 7C:
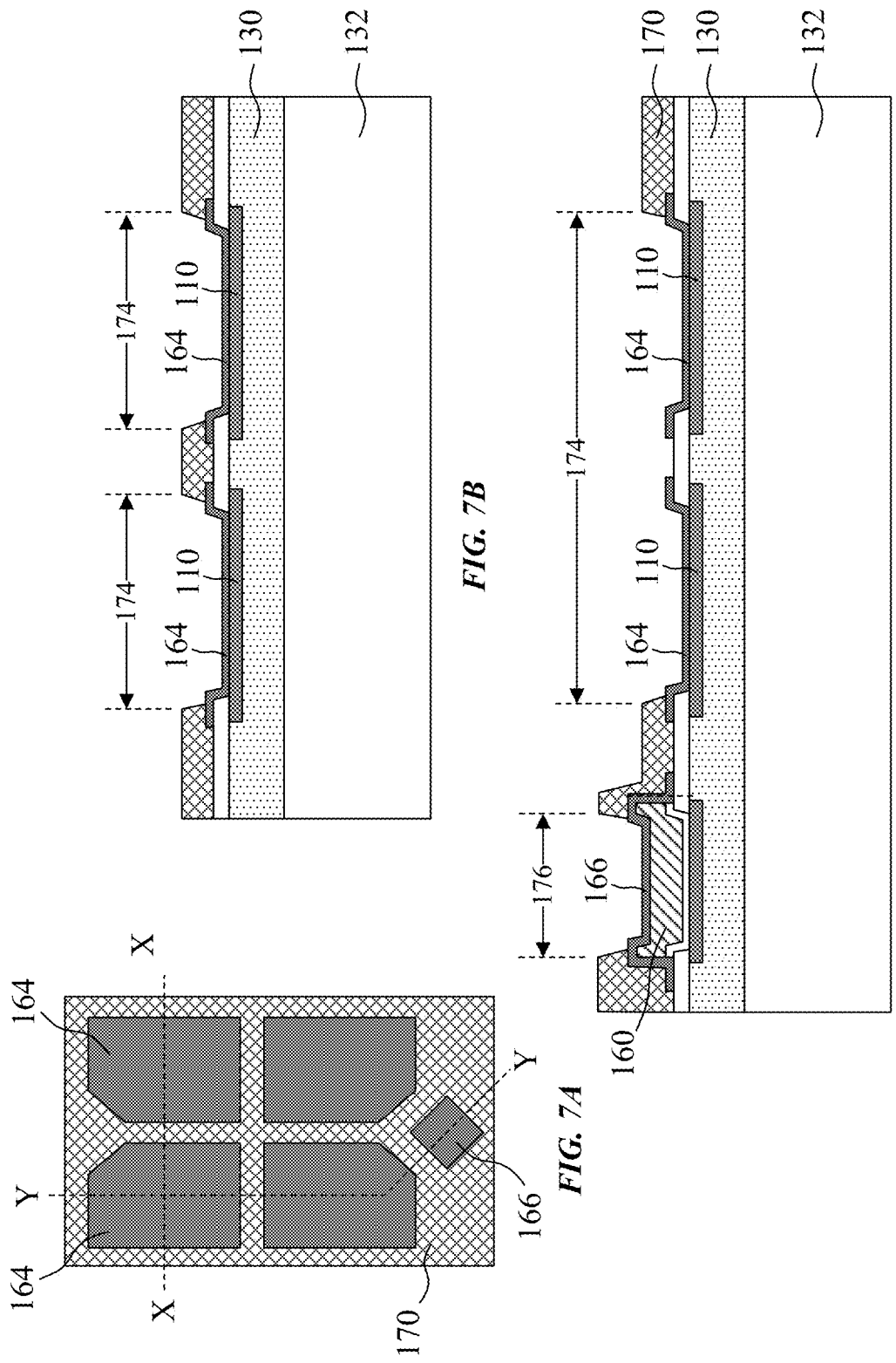
FIGS. 7A-7C are schematic top view and cross-sectional side view illustrations of an insulating layer including terminal stud openings and bank openings over the pads in accordance with an embodiment, with FIG. 7B taken along line X-X of FIG. 7A and FIG. 7C taken along line Y-Y of FIG. 7A.

A bank layer 170 may then be formed and patterned to include bank openings 174 over the pads 110 and terminal stud openings 176 over the Vs studs 160 as illustrated in FIGS. 7A-7C. The bank layer layer 170 may include one or more layers. For example, the bank layer may include $SiO_2$, $SiN_x$ or a stack of $SiO_2/SiN_x$ with $SiN_x$ on top. In the particular embodiment illustrated in FIG. 7C, the bank openings 174 may surround a pair of pads 110 within a subpixel. As shown in FIG. 7B, pads 110 in adjacent subpixels are separated by the bank layer 170. As shown in FIG. 7C, pads 110 within the same subpixel are not separated by the bank layer 170. In the particular embodiments illustrated, the bank openings 174 surround each subpixel. For example, this may inhibit color bleeding between different colored emissive LEDs within a pixel.

Figure 8A:
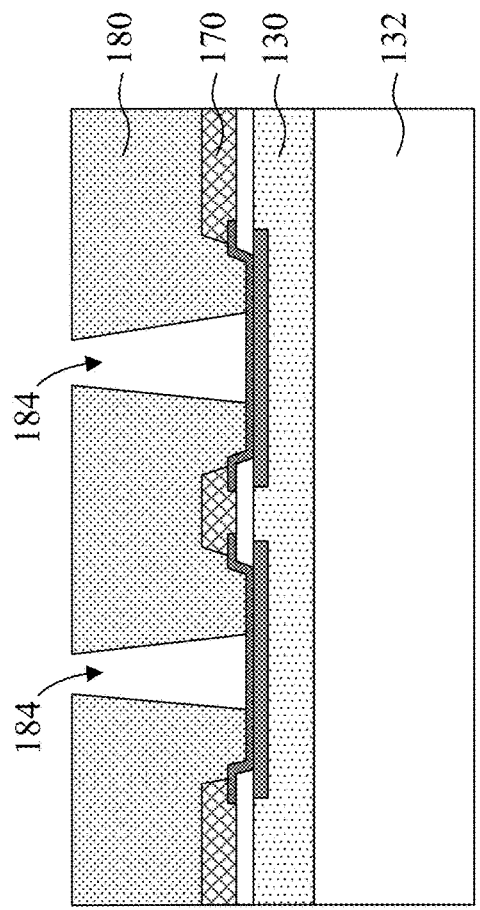
FIGS. 8A-8C are schematic top view and cross-sectional side view illustrations of a patterned resist layer in accordance with an embodiment, with FIG. 8B taken along line X-X of FIG. 8A and FIG. 8C taken along line Y-Y of FIG. 8A.
Figure 8B:
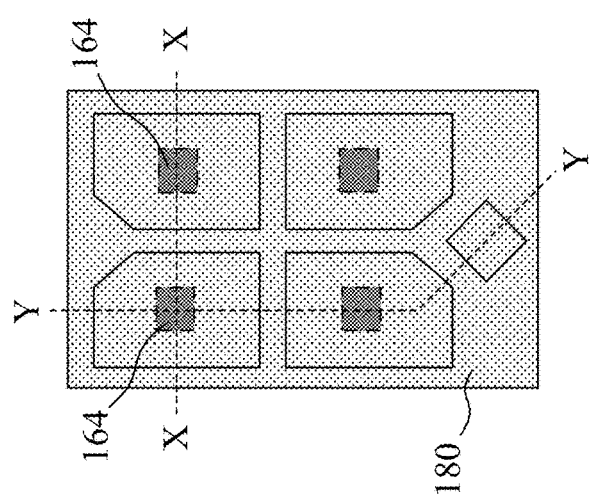
Figure 8C:
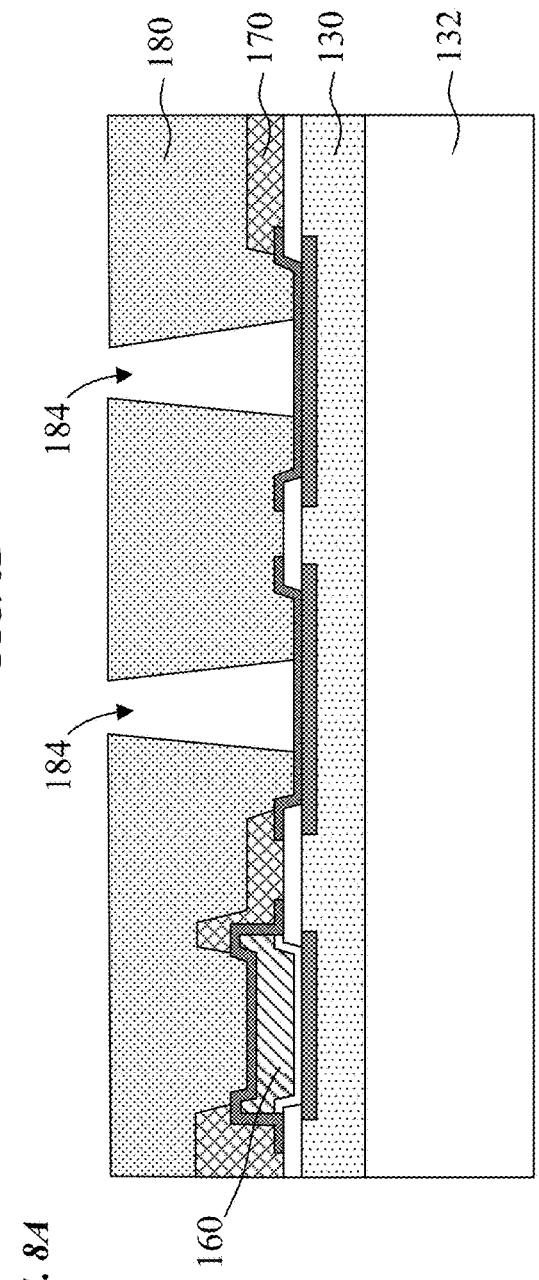
Figure 9B:
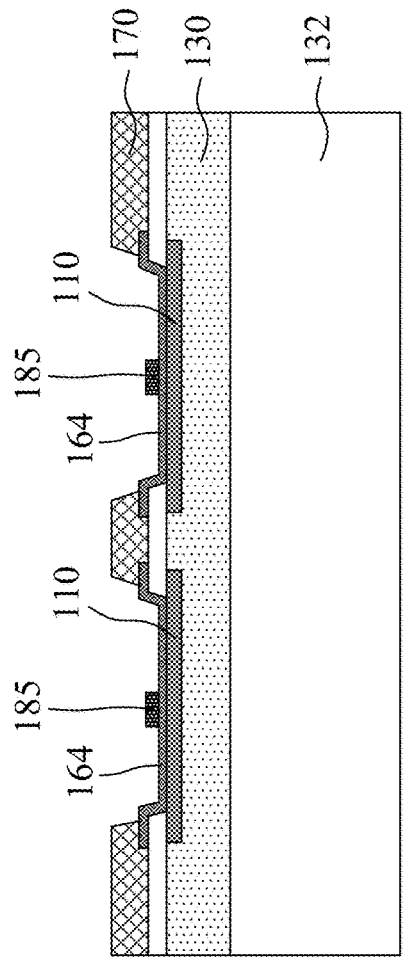
FIGS. 9A-9C are schematic top view and cross-sectional side view illustrations of a bonding material deposited on the pads in accordance with an embodiment, with FIG. 9B taken along line X-X of FIG. 9A and FIG. 9C taken along line Y-Y of FIG. 9A.
Figure 9A:
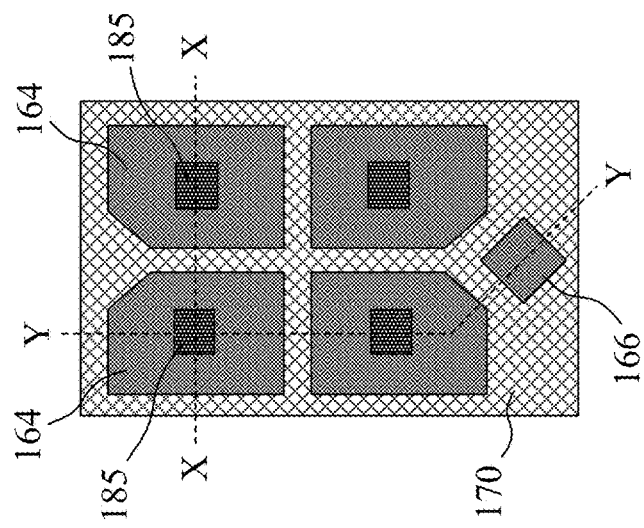
Figure 9C:
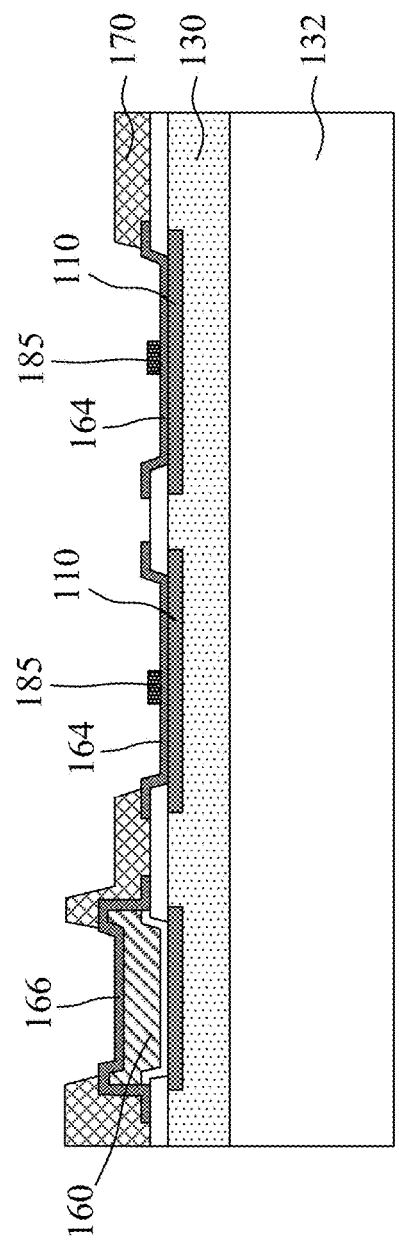

Referring now to FIGS. 8A-8C a resist layer 180 may be formed on the substrate, and patterned to form openings 184. In an embodiment, resist layer 180 is formed of a negative resist, which may aid in forming the outwardly tapered sidewalls (top to bottom) so that the openings are wider at the bottom of the resist layer 180 than at the top of the resist layer 108. In an embodiment, openings 184 are approximately 2 µm×2 µm or 2 µm diameter at the top of the resist layer 180, for example, for 10 µm or 5 µm wide LEDs. Bonding layers 185 may then be deposited on the pads 110, or pad adhesion layers 164, when present, as illustrated in FIGS. 9A-9C. In an embodiment, bonding layers 185 are deposited using evaporation or sputtering over the resist layer 180. The resist layer 180 is then lifted off, for example using a solvent, leaving behind laterally separate bonding layers 185, which may be in the form of posts. Bonding layers 185 may be formed of a variety of materials for bonding with the LEDs, for example, a solder material. In an embodiment, bonding layers 185 are formed of indium. The outwardly tapered sidewalls of the openings 184 may facilitate lift-off without tearing the bonding layers 185. Alternatively, bonding layer 185 may be formed using electroplating with barrier/seed layers, and a plating mask such as photoresist.

Figure 10A:
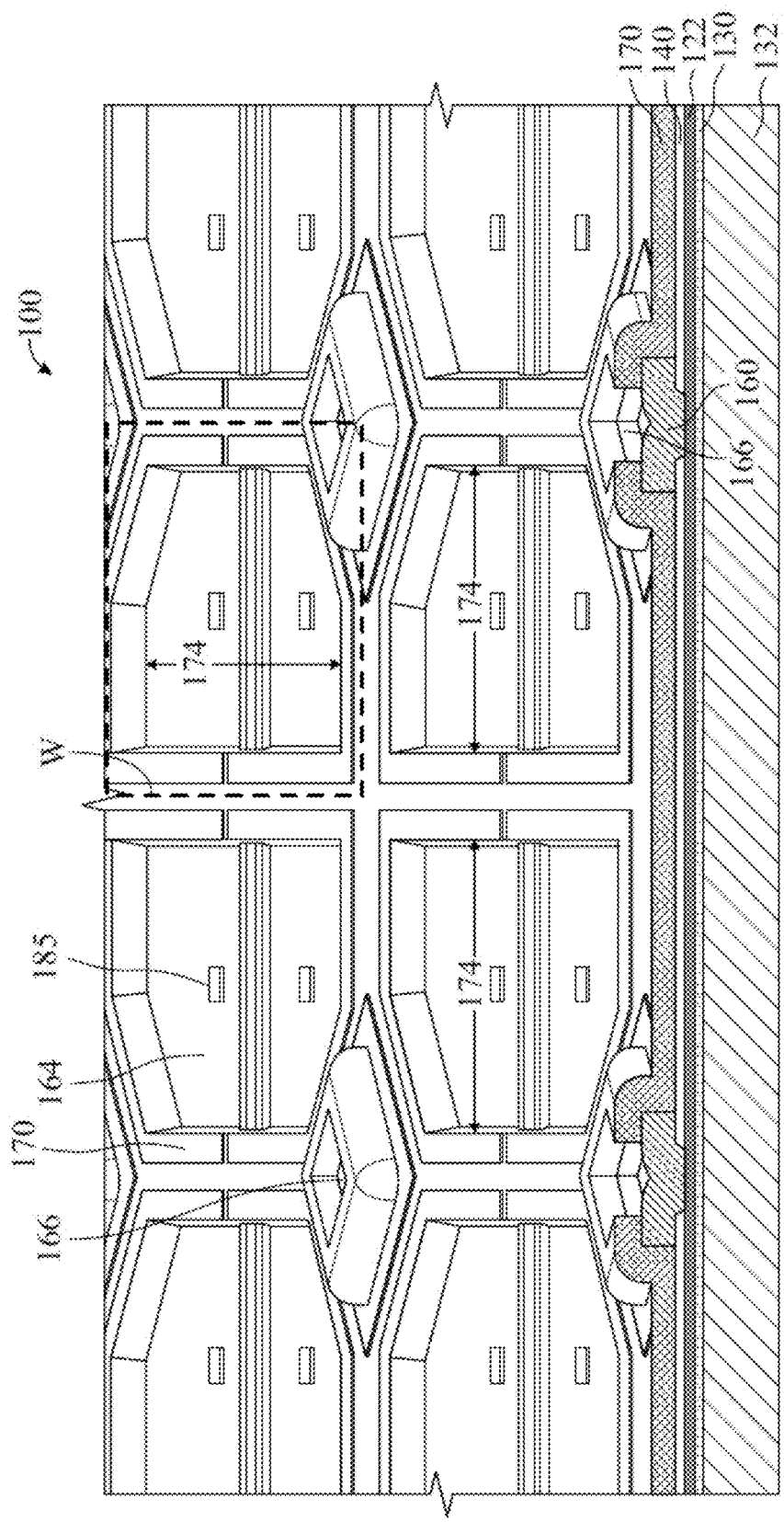
FIGS. 10A-10B are combination perspective view and cross-sectional side view illustrations of a display backplane including conductive terminal studs prior after the formation of bonding layers in accordance with an embodiment.
Figure 10B:
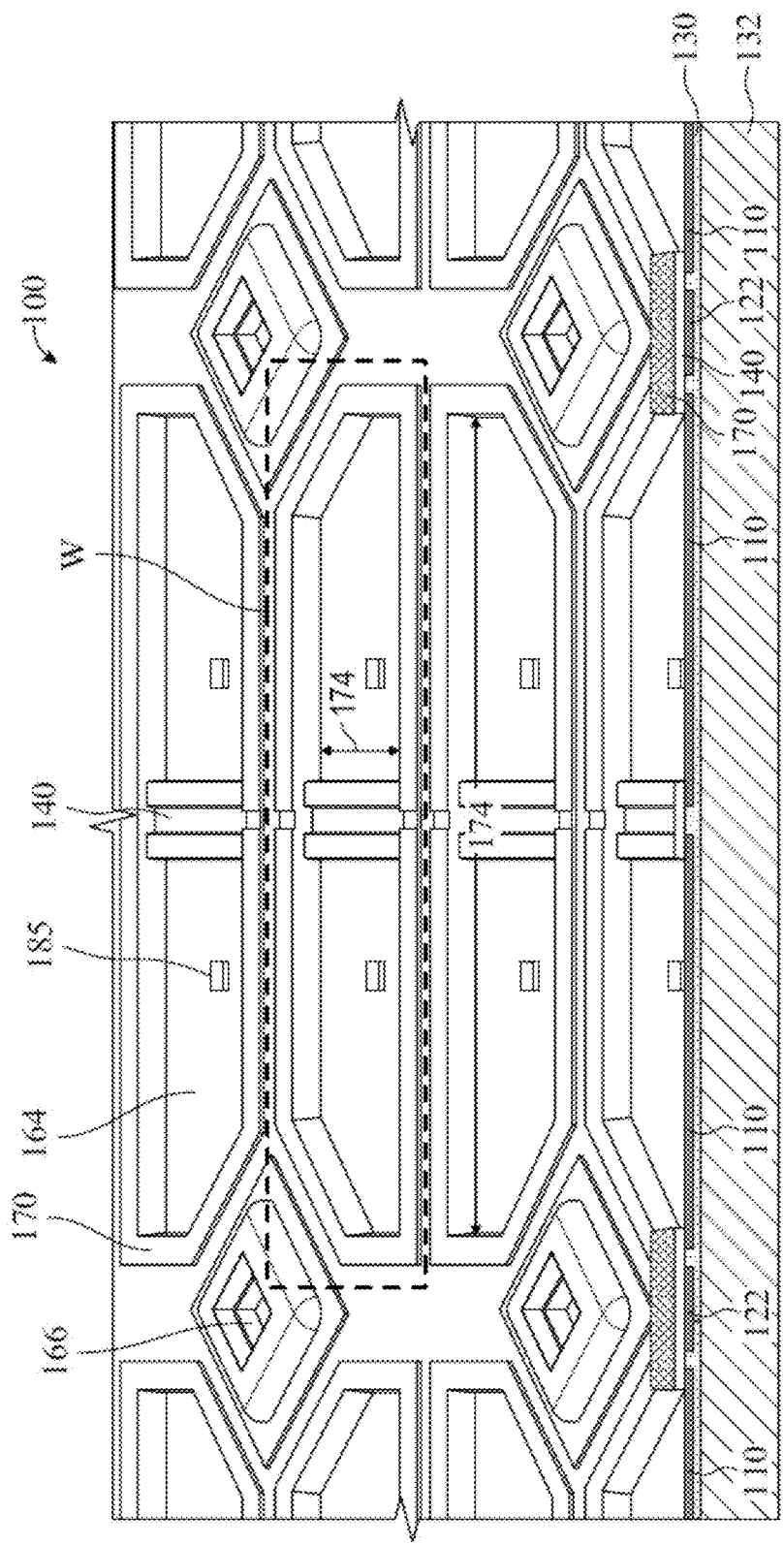

FIGS. 10A-10B are combination perspective view and cross-sectional side view illustrations of a display backplane 100 including conductive terminal studs after formation of the bonding layers 185 in accordance with an embodiment. As shown each well (W) may be formed by the bank openings 174 in bank layer 170. The sidewalls of each bank opening 174 may surround at least one LED. As shown, the sidewalls of each bank opening 174 may surround one subpixel, which may include a pair of pads 110 (and pad adhesion layers 164) for redundancy. The cross-sectional side view illustration provided in FIG. 10A illustrates the cross-section of discrete conductive terminal studs 160 formed along the conductive terminal lines 122. As shown the well (W) sidewalls are formed of a thickness of the passivation layer 140 and bank layer 170. The cross-sectional side view illustration provided in FIG. 10B illustrates the cross-section across the pads 110 and conductive terminal lines 122.

Referring now to FIGS. 11A-11C LEDs 150 are bonded to the pads 110, or pad adhesion layers 164 when present, using the bonding layers 185. In an embodiment, arrays of LEDs 150 are transferred using an electrostatic transfer head assembly, and bonding includes heating the LEDs 150 and bonding layers 185 with a heater, for example, located within the electrostatic transfer head assembly. As shown in FIG. 10B, each LED 150 may include a p-n diode 154 which includes an active layer 153, a bottom conductive contact 152, and a top conductive contact 156. The top and bottom conductive contacts 156, 152 may include one or more layers. In an embodiment, the bottom conductive contact includes a layer for making ohmic contact with the p-n diode 154, and a diffusion layer for bonding with the bonding layer 185. For example, in one embodiment, the diffusion layer is formed of gold, and bonding of the LEDs 150 includes intermixing of the diffusion layer and the bonding layer 185. For example, bonding may include the formation of eutectic bonds, e.g. gold-indium. Additional layers may optionally be included in the top and bottom conductive contacts 156, 152 including diffusion barriers, adhesion layers, or mirror layers, etc.

In the embodiment illustrated in FIGS. 12A-12C a sidewall passivation layer 188 is applied around the LEDs 150 within the bank openings 174. As shown, the sidewall passivation layer 188 may include a level top surface 190 that is above an active layer 153 (e.g. including one or more quantum wells) for each of the LEDs 150. The sidewall passivation layer 188 may provide electrical insulation for sidewalls of the LEDs 150, mechanically secure the LEDs 150 to the backplane, provide a moisture barrier, and also provide step coverage for application of the top electrode layer. In an embodiment, the wells formed by bank openings 174 are filled with the sidewall passivation layer 188. The sidewall passivation layer 188 may be formed of a dielectric material. The sidewall passivation layer 188 may be formed of a cross-linked material, such as acrylic or epoxy. In accordance with embodiments, the sidewall passivation layer 188 may be applied to the wells using a technique such as ink jet printing or slit coating, followed by cure and etchback to ensure the top of the LEDs 150 (e.g. top conductive contacts 156) and top of the conductive terminal studs 160 (e.g. conductive terminal stud adhesion layers 166) are exposed.

A top electrode layer 198 is then formed on the LEDs 150 and the conductive terminal studs 160 as shown in the embodiments illustrated in FIGS. 13A-13C. The top electrode layer 198 may be formed of a variety of materials, such as transparent conductive oxides (TCOs) or transparent conductive polymers. In an embodiment, top electrode layer 198 is formed of indium-tin-oxide (ITO), and may be formed using a suitable technique such as sputtering, and optionally followed by patterning. In an embodiment, a blanket top electrode layer 198 is formed over each of the LEDs 150 in the array of LEDs and each of the conductive terminal studs 160 in the array of conductive terminal studs. In such a configuration, the top electrode layer 198 provides the conductive terminal connection to all of the LEDs 150 within the pixel area on the backplane. In an embodiment, a plurality of top electrode layers 198 is formed.

In an embodiment, a backplane 100 includes an array of pads 110, a corresponding array of LEDs 150 bonded to the array of pads 110, an array of conductive terminal pads 120, and a corresponding array of conductive terminal studs 160 on the conductive terminal pads 120. A sidewall passivation layer 188 is formed around (e.g. surrounding) each of the LEDs 150 in the array of LEDs 150. A top electrode layer 198 is on and in electrical contact with the array of LEDs 150 and the array of conductive terminal studs 160. The sidewall passivation layer 188 may include a level top surface 190 around the array of LEDs 150. In an embodiment, the backplane 100 additionally includes a bank layer 170 with an array of bank openings 174 over the array of pads 110 and an array of terminal stud openings 176 over the array of conductive terminal studs 160. The top electrode layer 198 may be formed over the bank layer 170, and the sidewall passivation layer 188 may be contained within the array of bank openings 174. In the embodiment illustrated, sidewalls of each bank opening 174 surround one corresponding subpixel.

In accordance with embodiments, the formation of a wells (W) with the bank layer (e.g. dielectric layer) provides for optically isolated subpixels. The bottom of these wells have an electrically conductive pad adhesion (barrier) layer 164 (e.g. tantalum nitride) that may prevent reaction between the underlying metal interconnects (e.g. pads 110) made of copper or aluminum with the bonding layer (e.g. indium) on which the LEDs are placed. In accordance with embodiments, a common top electrode layer 198 (e.g. conductive terminal electrode layer) may be formed after the LEDs 150 have been bonded to the backplane 100 inside the wells (W). The common top electrode layer 198 can be formed of a conductive transparent film such as ITO that contacts one side of the LEDs 150, and also connects to the underlying metal layers via the conductive terminal studs 160 that, in some embodiments, may be made of aluminum and covered with tantalum nitride. The conductive terminal studs 160 allow the ITO layer to be connected to the metal layers underneath and be routed to bond pads which connect to external low voltage source.

Figure 14:
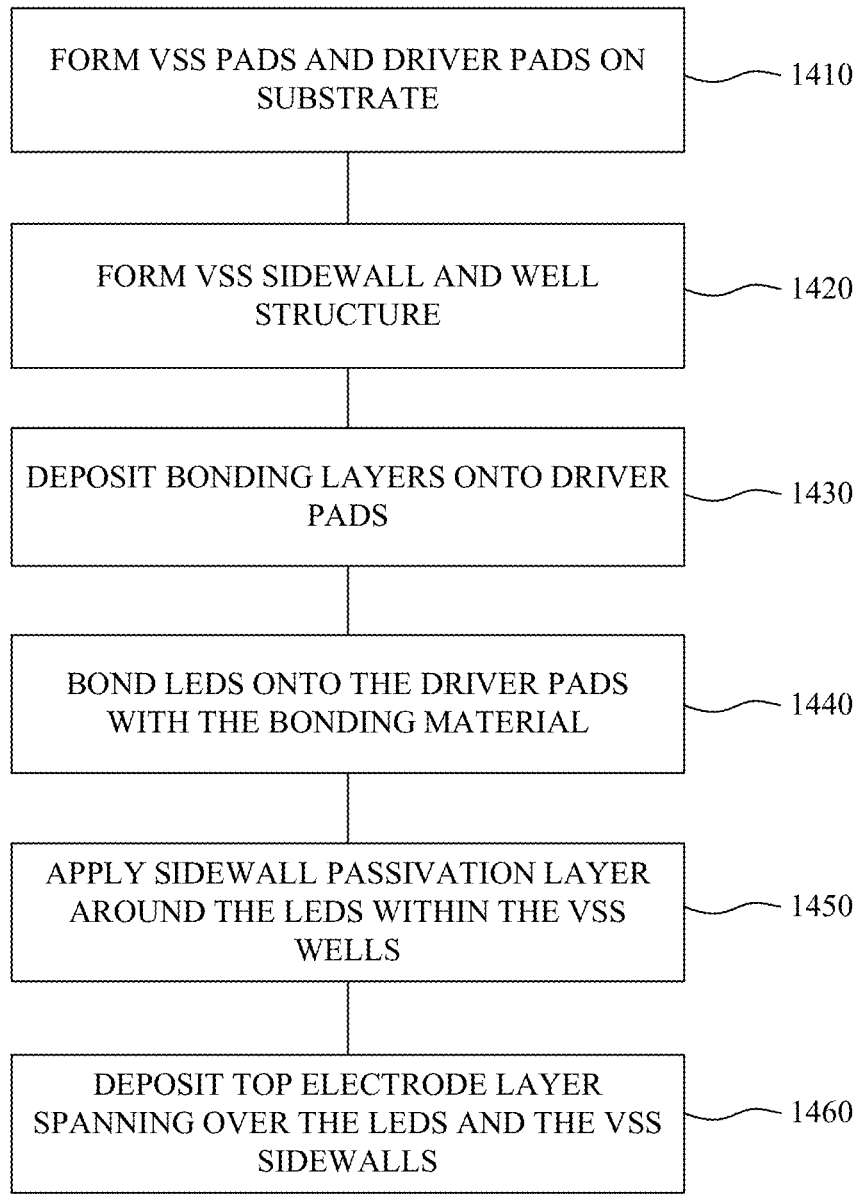
FIG. 14 is a flow chart illustrating a method of electrically connecting LEDs with conductive terminal sidewalls in accordance with an embodiment.

Referring now to FIG. 14 a flow chart is provided illustrating a method of electrically connecting LEDs with conductive terminal sidewalls in accordance with an embodiment. In interest of clarity, the following description of FIG. 14 is made with regard to reference features found in other figures described herein, particularly FIGS. 15-20B.

At operation 1410 an array of conductive terminal pads 120 and an array of pads 110 are formed on a substrate. At operation 1420 conductive terminal sidewalls 161 and well (W) structures are formed. Bonding layers 195 may be deposited onto the pads 110 at operation 1430, followed by bonding an array of LEDs 150 to the array of pads 110 with the bonding layers 195 at operation 1440. At operation 1450 a sidewall passivation layer 188 is applied around the LEDs 150 and within the conductive terminal wells (W). A top electrode layer 198 is then deposited on the LEDs 150 and the conductive terminal sidewalls 161 at operation 1470.

In the process sequence illustrated in FIGS. 15-20B perspective view illustrations are provided for forming conductive terminal sidewalls in accordance with an embodiment. The operations associated with the process sequence illustrated in FIGS. 15-20B may be similar to those previously described and illustrated with regard to FIGS. 2-13C, with one difference being that conductive terminal sidewalls are formed to create wells (W) around the LEDs rather than using a bank layer.

Figure 15:
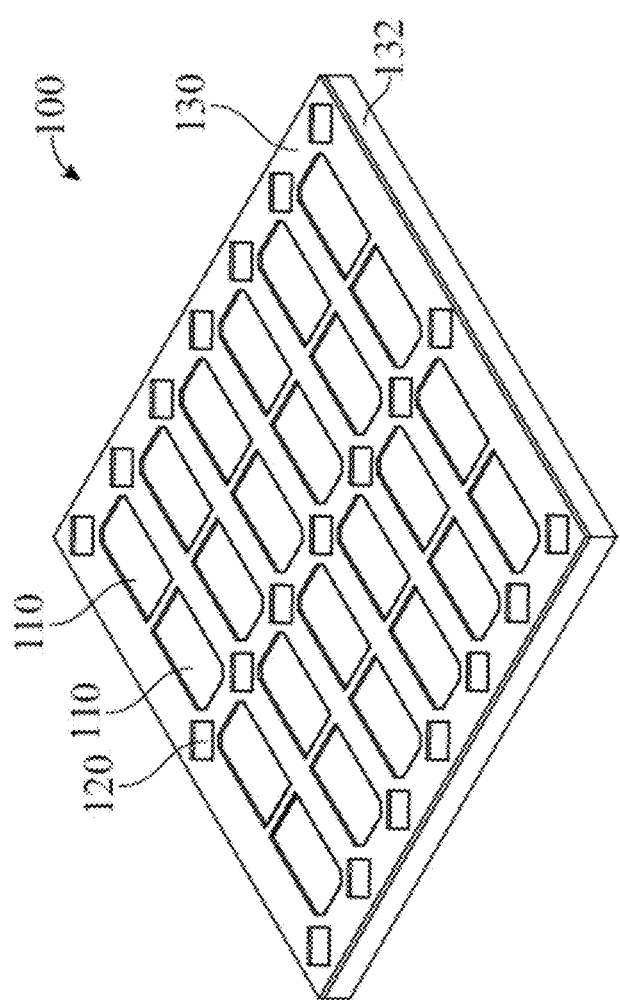
FIG. 15 is a perspective view illustrating the formation of pads and conductive terminal pads in accordance with an embodiment.
Figure 16:
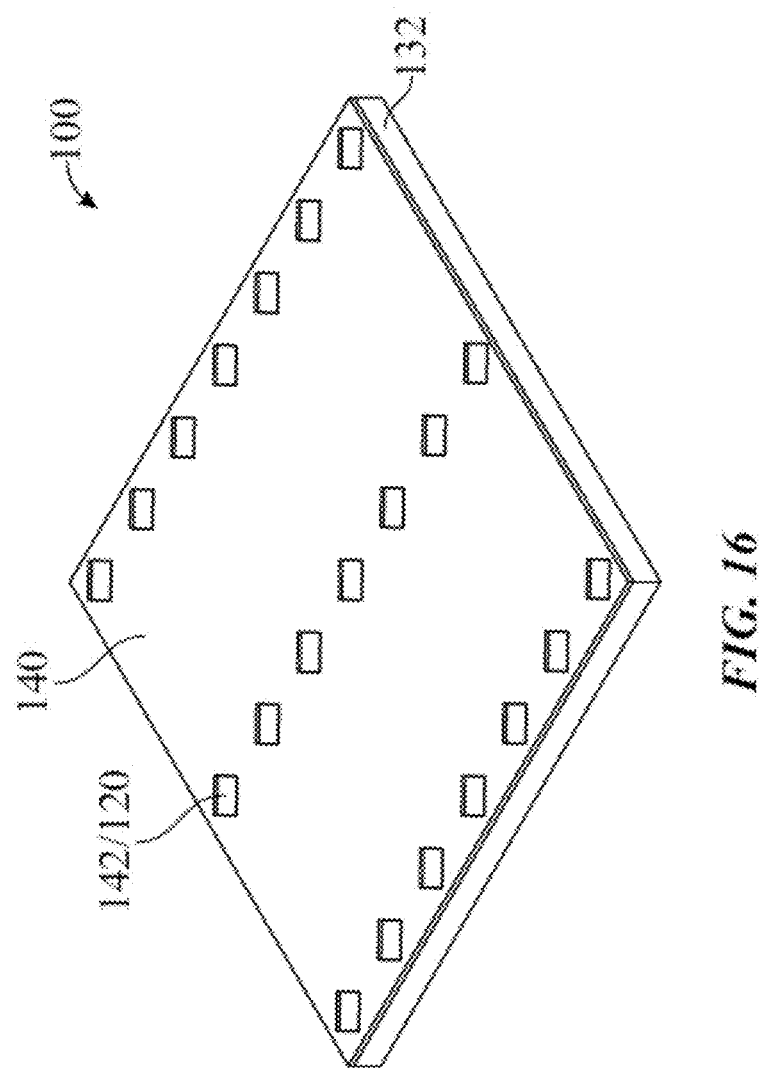
FIG. 16 is a perspective view illustrating the formation of a passivation layer and via openings exposing conductive terminal pads in accordance with an embodiment.
Figure 17:
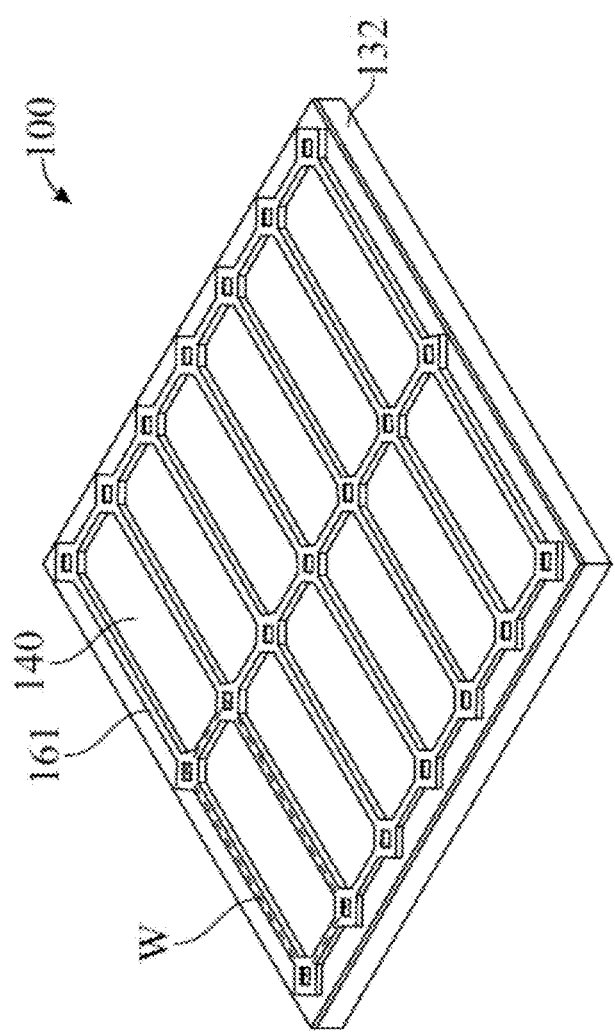
FIG. 17 is a perspective view illustrating the formation of conductive terminal sidewall and well structures in accordance with an embodiment.

FIG. 15 is a perspective view illustrating the formation of pads 110 and conductive terminal pads 120 in accordance with an embodiment. The exposed pads 110 and conductive terminal pads 120 may be on a planar surface (e.g. chemical mechanical polish), and surrounded by a dielectric layer of the build-up structure 130. FIG. 15 may be substantially similar to the structure illustrated and described with regard to FIGS. 3A-3C. In an embodiment, exposed conductive terminal lines 122 may optionally run between conductive terminal pads 120 as illustrated and described with regard to FIGS. 3A-3C. FIG. 16 is a perspective view illustrating the formation of a passivation layer 140 and terminal openings 142 exposing conductive terminal pads 120 in accordance with an embodiment. FIG. 17 is a perspective view illustrating the formation of conductive terminal sidewalls 161 and well (W) structures in accordance with an embodiment. As shown, the conductive terminal sidewalls 161 are in electrical contact with the conductive terminal pads 120, and span over and across the passivation layer 140 between the terminal openings 142 to create the well (W) structures.

Figure 18:
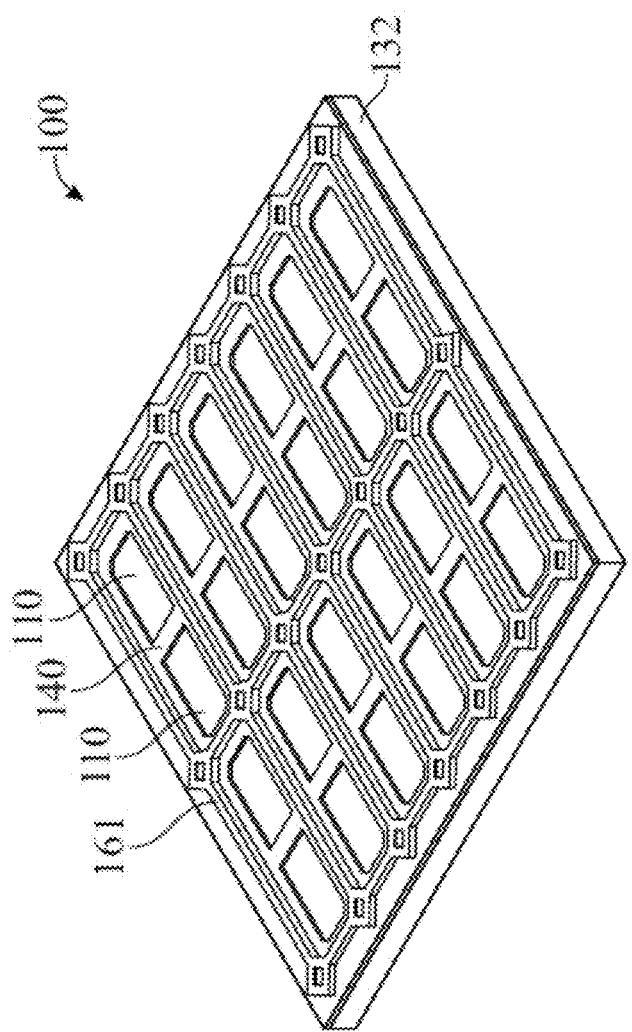
FIG. 18 is a perspective view illustrating exposed pads in accordance with an embodiment.
Figure 19:
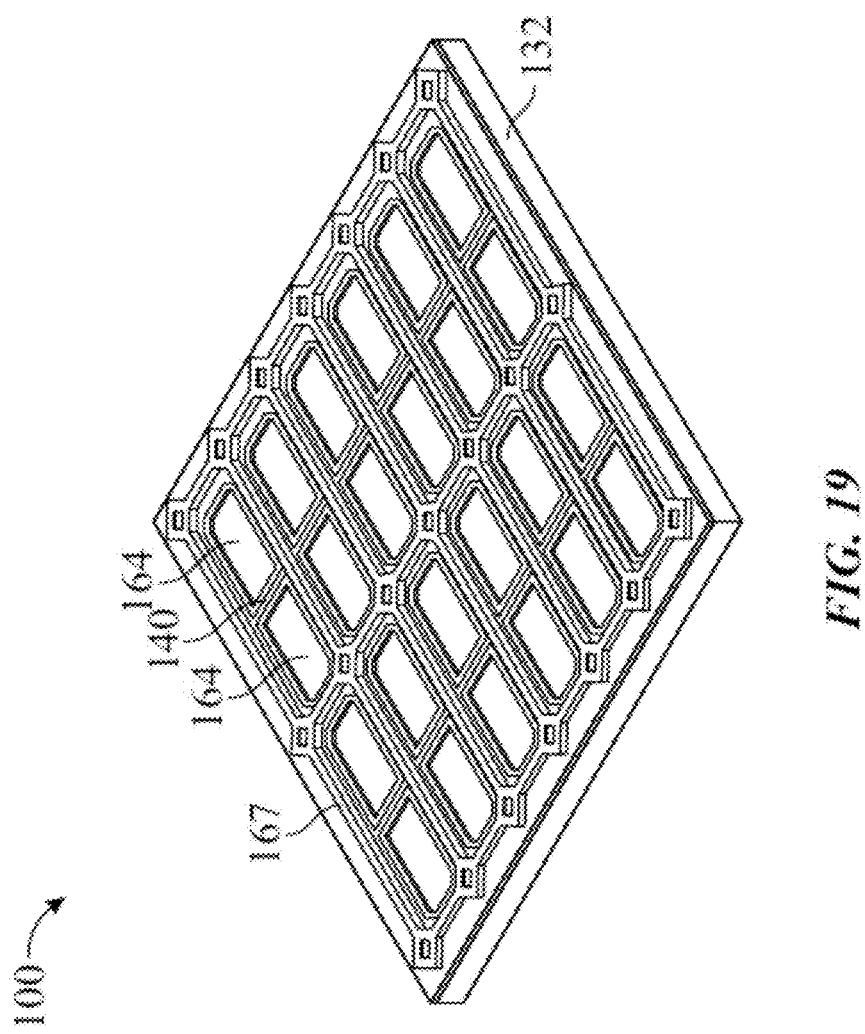
FIG. 19 is a perspective view illustrating a patterned adhesion layer formed over the conductive terminal sidewalls and pads in accordance with an embodiment.

Referring to FIG. 18, pad openings are formed in the passivation layer 140 to expose pads 110. A patterned adhesion layer may then be formed over the conductive terminal sidewalls and pads. As illustrated in FIG. 19, the patterned adhesion layer may include a conductive terminal sidewall adhesion layer 167 and pad adhesion layers 164.

Figure 20A:
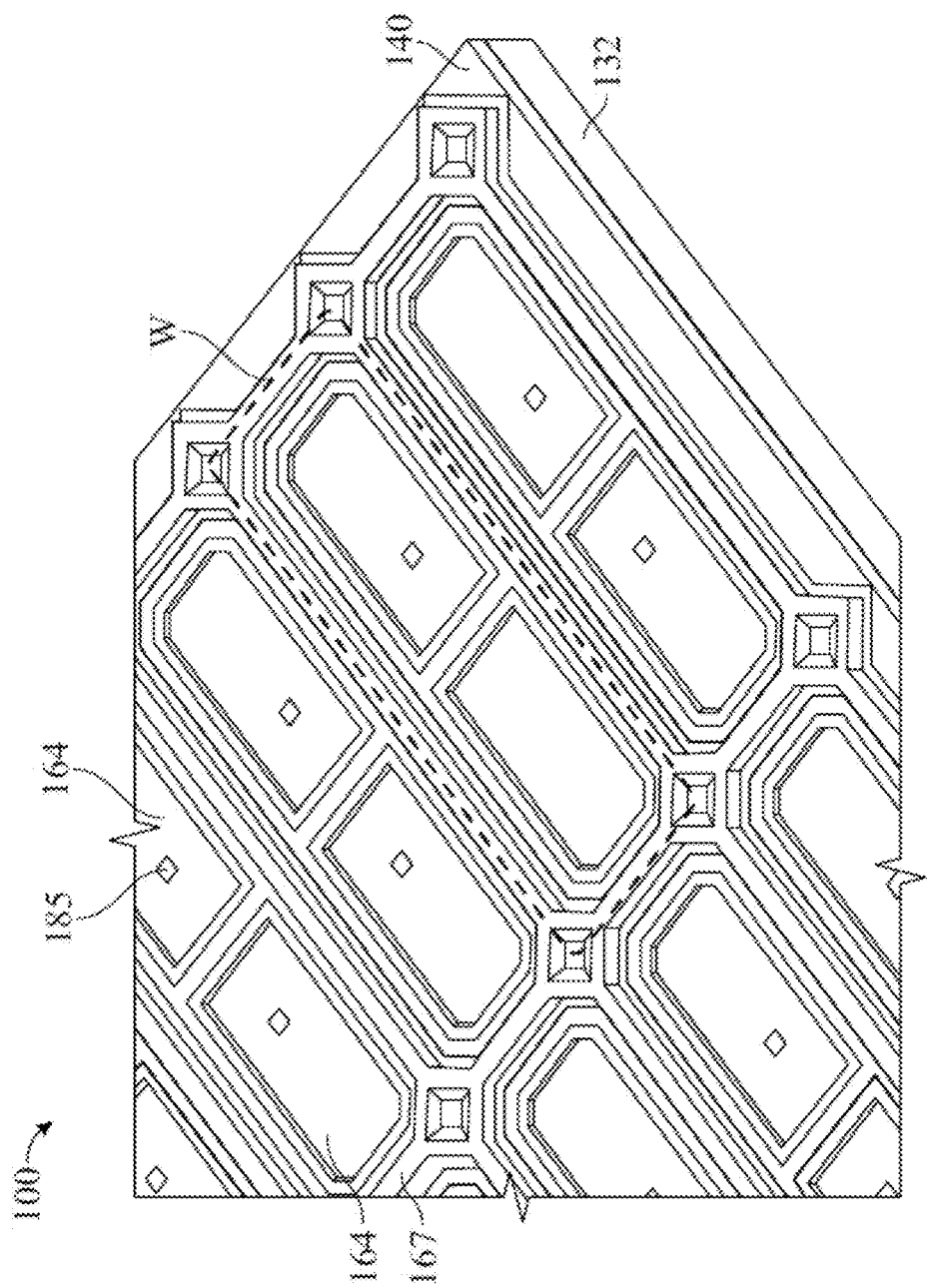
FIG. 20A is a close-up perspective view illustrating the forming of a bonding material on the pads in accordance with an embodiment.
Figure 20B:
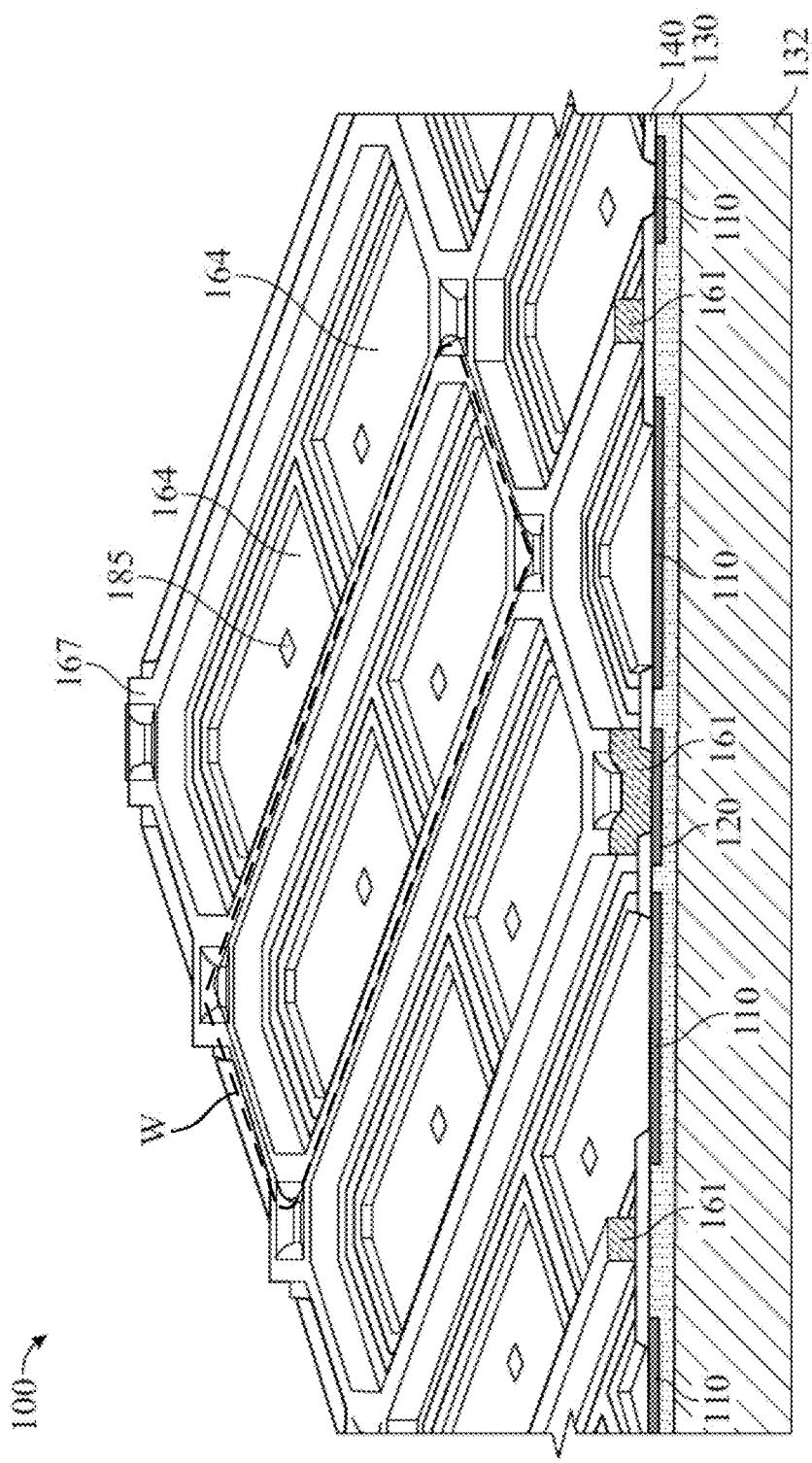
FIG. 20B is a combination perspective view and cross-sectional side view illustration of a display backplane including conductive terminal sidewalls prior to bonding the LEDs to the pads in accordance with an embodiment.

FIGS. 20A-20B are close-up perspective views illustrating the display backplane 100 after the formation of bonding layers 185 on the pad adhesion layers 164. FIG. 20B additionally includes a cross-sectional side view illustration showing the conductive terminal sidewall 161 cross-section in accordance with an embodiment. LEDs 150 may then be bonded to the backplane, a sidewall passivation layer 188 applied around the LEDs 150, and a top electrode layer 198 formed similarly as described above with regard to FIGS. 11A-13C.

In an embodiment, a backplane includes an array of pads 110, a corresponding array of LEDs 150 bonded to the array of pads 110, and an array of conductive terminal well (W) structures with each conductive terminal well structure including conductive terminal sidewalls 161 that surround at least one LED 150. A sidewall passivation layer 188 is around (e.g. surrounding) each of the LEDs 150 in the array of LEDs 150, and the sidewall passivation layer 188 is contained within the conductive terminal well (W) structures by conductive terminal sidewalls 161. In an embodiment, the sidewall passivation layer 188 may be completely contained within the conductive terminal well (W) structures. In an embodiment, the sidewall passivation layer 188 includes a level top surface 190 within the array of conductive terminal well (W) structures. A top electrode layer 198 may be formed on an in electrical contact with the array of LEDs 150 and the array of conductive terminal sidewalls 161.

The backplane 100 may further include a passivation layer 140 with a first array of pad openings 144 over the array of pads 110 and a second array of terminal openings 142 over an array of conductive terminal pads 120. As illustrated in FIG. 18, the conductive terminal sidewalls 161 connect adjacent conductive terminal pads 120 and span over the passivation layer 140. As illustrated in FIG. 19 a conductive terminal sidewall adhesion layer 167 is formed on the conductive terminal sidewalls 161 and an array of pad adhesion layers 164 is formed on the array of pads 110, with the array of pad adhesion layers 164 being electrically insulated from the conductive terminal sidewall adhesion layer 167. In an embodiment, the sidewall passivation layer 188 is in direct contact with the conductive terminal sidewall adhesion layer 167 on the conductive terminal sidewalls 161. In an embodiment, the conductive terminal sidewall adhesion layer 167 and the array of pad adhesion layers 164 are formed of tantalum nitride.

As shown in the close-up illustrations provided in FIGS. 20A-20B, the conductive terminal sidewalls 161 may be shared between adjacent conductive terminal wells (W). In an embodiment, each conductive terminal well (W) includes conductive terminal sidewalls 161 surrounding a single subpixel. In the particular embodiment illustrated, each subpixel includes a pair of independently addressable pads 110, and a corresponding pair of LEDs 150.

In accordance with embodiments, a conductive terminal well (W) structure allows for the formation of well structures without the processing operations associated with the formation and patterning of a bank layer. In addition, where a patterned bank layer 170 is not formed, a thinner resist layer 180 may be utilized during the deposition of bonding layers 185 (e.g. see FIGS. 8B-8C), which may result in better control of the deposited bonding layer and profile of the openings 184. A conductive terminal well (W) structure may additionally provide increased surface area for connecting with the top electrode layer 198, which may potentially reduce conductive terminal routing metal width and lower top electrode contact resistance to provide uniform optical performance.

Figure 21:
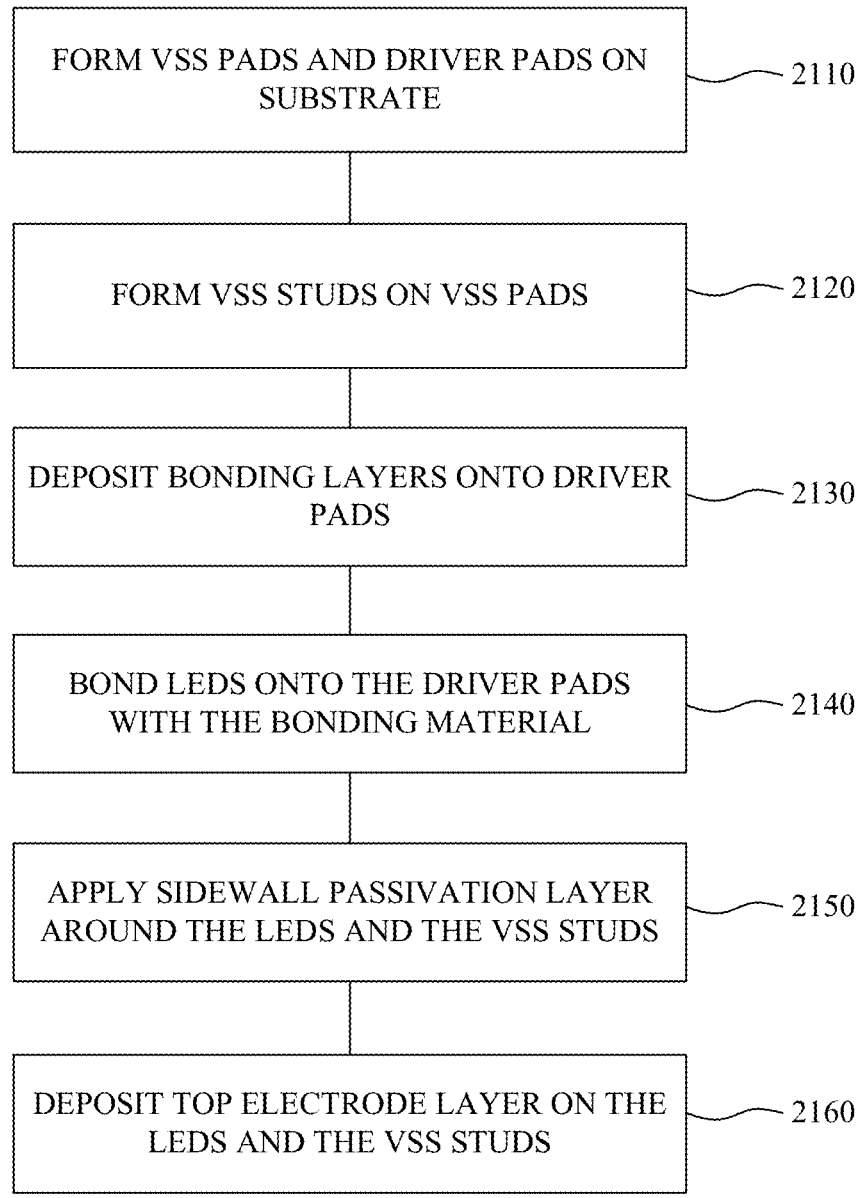
FIG. 21 is a flow chart illustrating a method of electrically connecting LEDs with conductive terminal studs in accordance with an embodiment.

FIG. 21 is a flow chart illustrating a method of electrically connecting LEDs with conductive terminal studs in accordance with an embodiment. In interest of clarity, the following description of FIG. 21 is made with regard to reference features found in other figures described herein, particularly FIGS. 22A-28B.

At operation 2110 an array of conductive terminal pads 120 and an array of pads 110 are formed on a substrate. At operation 2120 an array of conductive terminal studs 160 is formed on the array of conductive terminal pads 120. Bonding layers 185 may be deposited onto the pads 110 at operation 2130, followed by bonding an array of LEDs 150 to the array of pads 110 with the bonding layers 185 at operation 2140. At operation 2150 a sidewall passivation layer 188 is applied around the LEDs 150 and the conductive terminal studs 160. A top electrode layer 198 is then deposited on the LEDs 150 and the conductive terminal studs 160 at operation 2160.

Figure 22A:
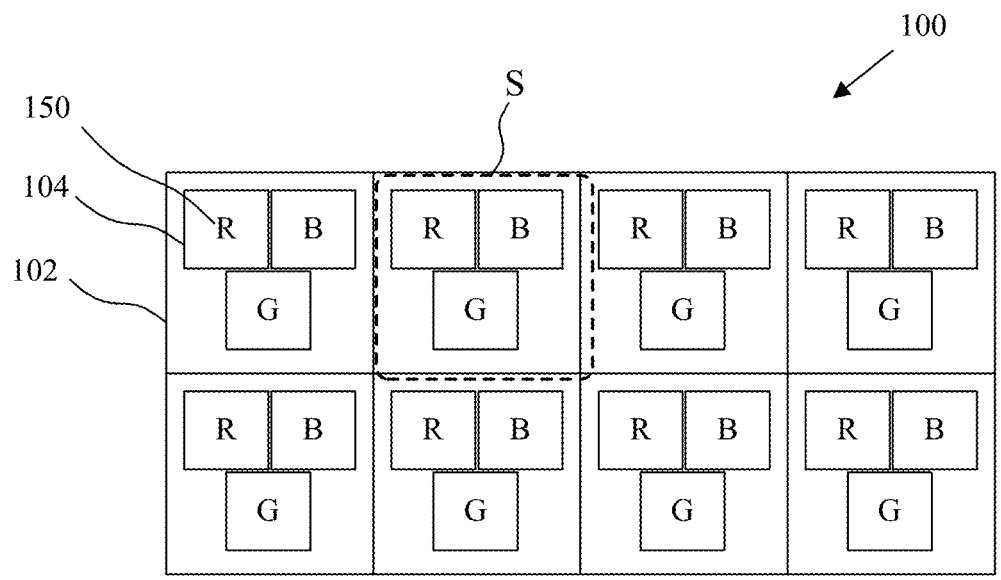
FIGS. 22A-22B are schematic top view illustrations of pixel arrangements in accordance with embodiments.
Figure 22B:
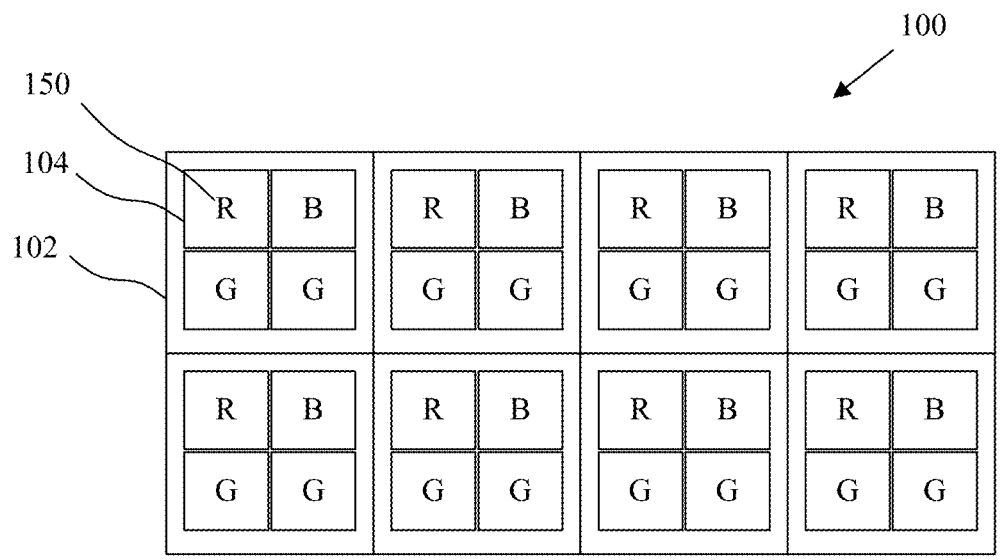

FIGS. 22A-22B are schematic top view illustrations of arrangements of pixels 102 in accordance with embodiments. In the particular embodiments illustrated in FIGS. 22A-22B, exemplary red-green-blue (RGB) display pixel layouts are provided. In the particular embodiment illustrated in FIG. 22A, each pixel 102 includes a red emitting subpixel 104, a green emitting subpixel 104, and a blue emitting subpixel 104. However, the specific resolution and RGB color scheme is for illustrational purposes only, and embodiments are not so limited. In the embodiment illustrated in FIG. 22B, multiple green subpixels 104 are provided in available space. Redundancy may also be optionally included within subpixels.

Referring now to FIGS. 23A-28B perspective view illustrations are provided for forming conductive terminal sidewalls in accordance with an embodiment. The operations associated with the process sequence illustrated in FIGS. 23A-28B may be similar to those previously described and illustrated with regard to FIGS. 3-13C, with one difference being that a bank layer is not formed to create wells around the LEDs.

Figure 23B:
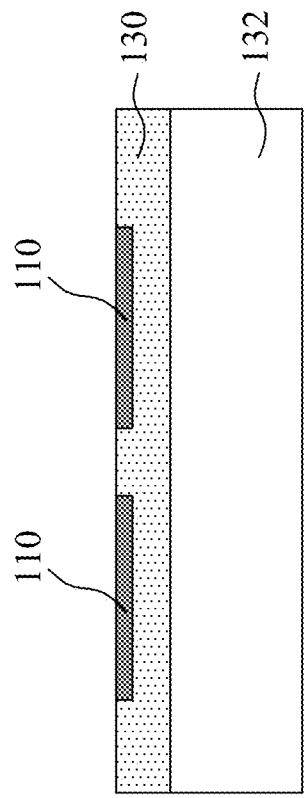
FIGS. 23A-23C are schematic top view and cross-sectional side view illustrations of pads and a conductive terminal pad for a subpixel in accordance with an embodiment, with FIG. 23B taken along line X-X of FIG. 23A and FIG. 23C taken along line Y-Y of FIG. 23A.
Figure 23C:
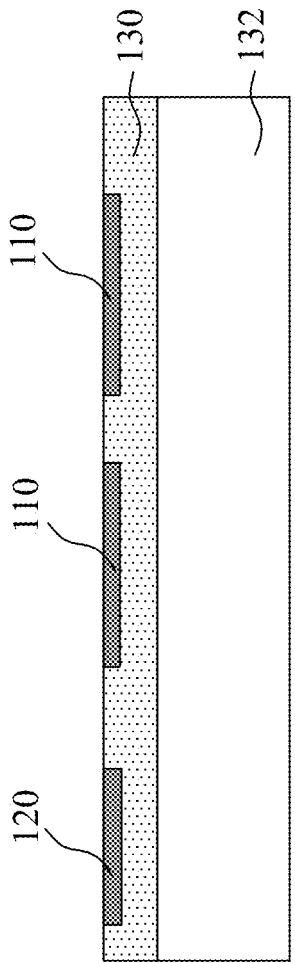
Figure 23A:
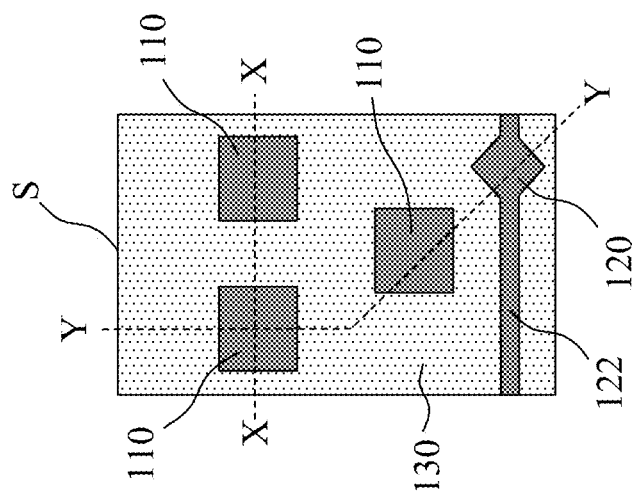

FIGS. 23A-23C illustrate the formation of pads 110 and conductive terminal pads 120 for a pixel similarly as described above with regard to FIGS. 3A-3C. FIG. 23A is a schematic top view illustration of pads 110 and a conductive terminal pad 120 for a pixel in accordance with an embodiment. The particular sub-section taken in FIG. 23A is along section-S illustrated in FIG. 22A. FIG. 23B is a schematic cross-sectional side view illustration taken along line X-X of FIG. 23A in accordance with an embodiment. FIG. 23C is a schematic cross-sectional side view illustration taken along line Y-Y of FIG. 23A in accordance with an embodiment. The exposed pads 110 and conductive terminal pads 120 may be on a planar surface (e.g. chemical mechanical polish), and surrounded by a dielectric layer of the build-up structure 130. In an embodiment, exposed conductive terminal lines 122 run between conductive terminal pads 120.

Figure 25B:
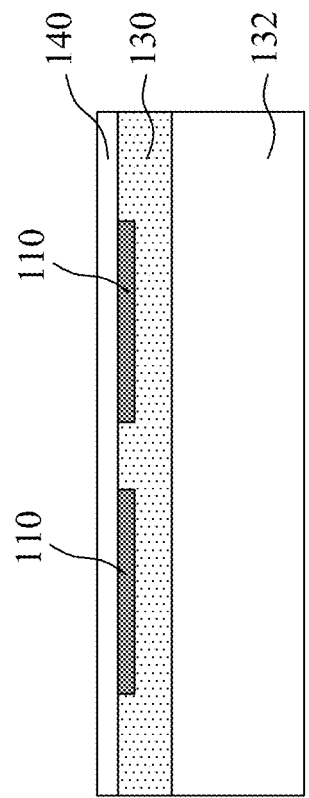
FIGS. 25A-25C are schematic top view and cross-sectional side view illustrations of the formation of a conductive terminal stud in accordance with an embodiment, with FIG. 25B taken along line X-X of FIG. 25A and FIG. 25C taken along line Y-Y of FIG. 25A.
Figure 25C:
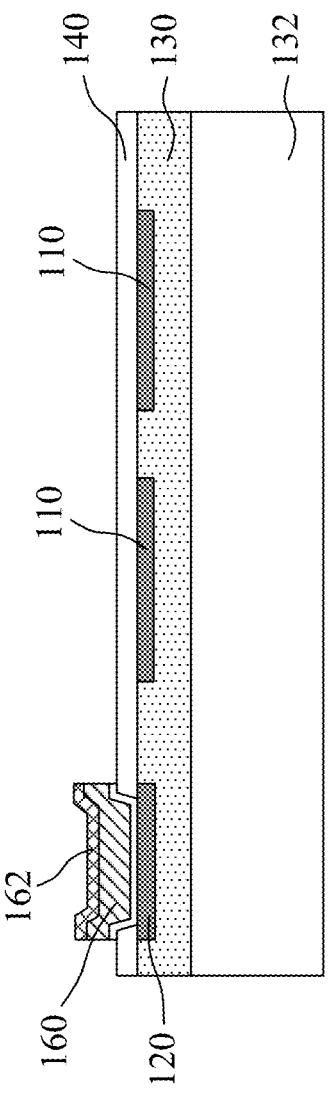
Figure 25A:
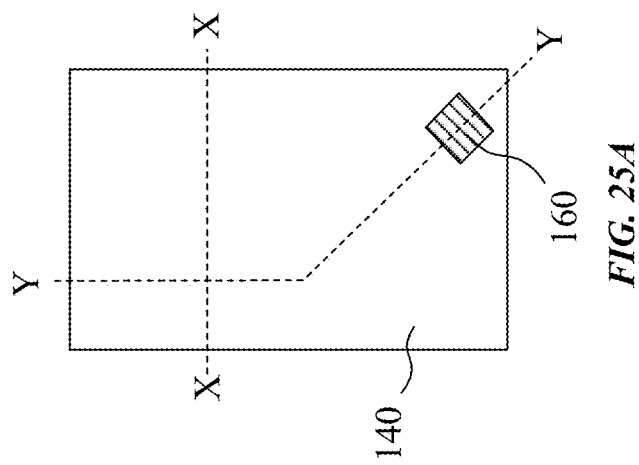

As illustrated in FIGS. 24A-24C a passivation layer 140 is formed and patterned to include terminal openings 142 exposing conductive terminal pads 120 in accordance with an embodiment, similarly as illustrated and described with regard to FIGS. 4A-4C. As illustrated in FIGS. 25A-25C conductive terminal studs 160 may be formed on conductive terminal pads 120, similarly as illustrated and described with regard to FIGS. 5A-5C. The conductive terminal studs 160 may optionally be covered with hark masks 162, such as SiN, to protect the conductive terminal studs 160 during subsequent processing operations.

Referring now to FIGS. 26A-26C, the passivation layer 140 may be etched. In an embodiment, the passivation layer 140 is removed to expose pads 110. Passivation layer 140 may additionally be removed to expose conductive terminal lines 122 between conductive terminal studs 160. In an embodiment, passivation layer 140 is completely removed, less any portion remaining underneath conductive terminal studs 160.

Figure 28A:
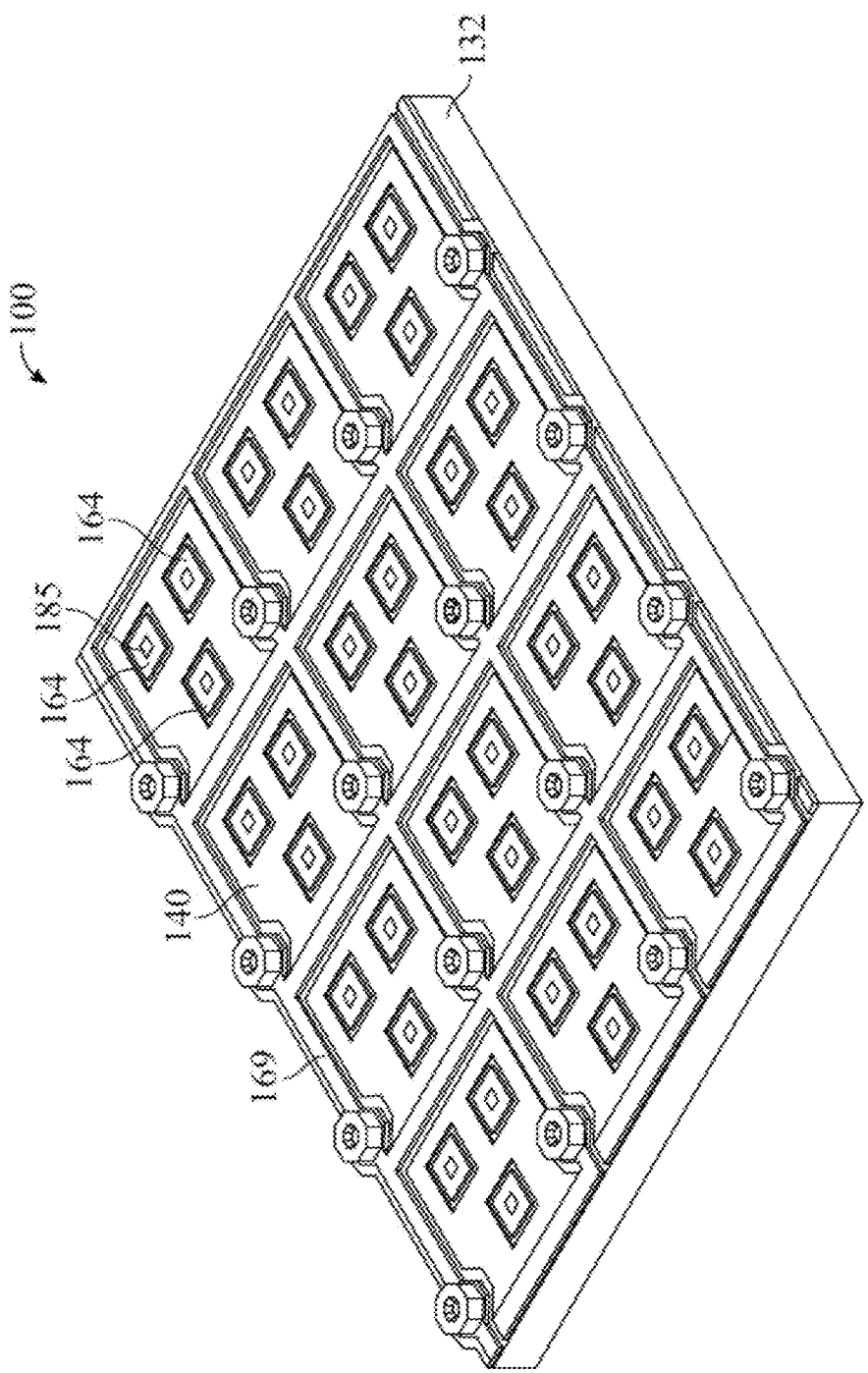
FIG. 28A is a perspective view illustration of a display backplane including conductive terminal studs prior to bonding the LEDs to the pads in accordance with an embodiment.
Figure 28B:
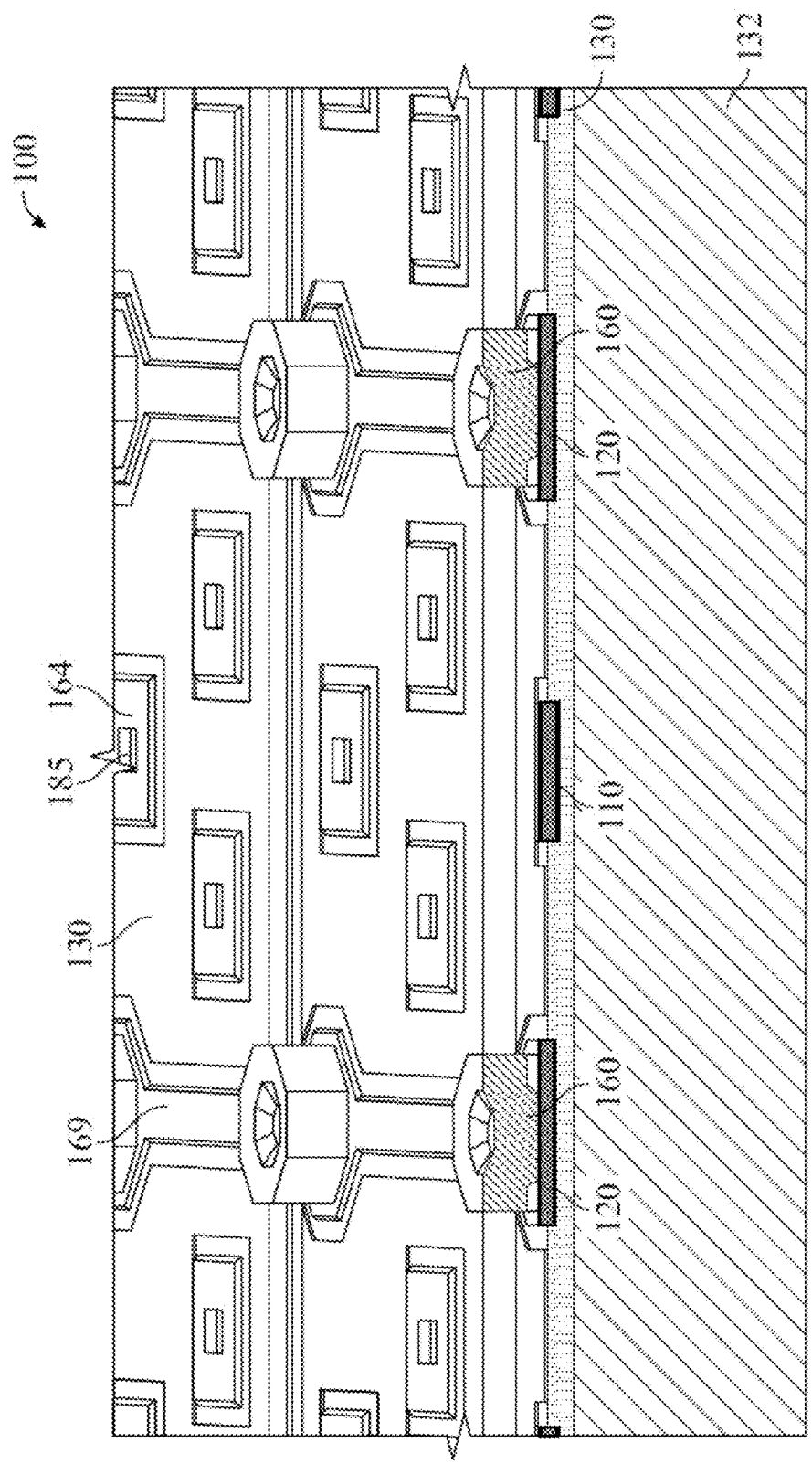
FIG. 28B is a combination perspective view and cross-sectional side view illustration of a display backplane including conductive terminal studs prior to bonding the LEDs to the pads in accordance with an embodiment.

Referring now to FIGS. 27A-27C a patterned adhesion layer is formed over conductive terminal studs 160 and pads 110, followed by deposition of bonding layers 185 in accordance with embodiments. The formation of the patterned adhesion layer and bonding layers may be similar as previously described with regard to FIGS. 6A-6C and FIGS. 8A-9C. In the particular embodiment illustrated in FIGS. 27A-27C, rather than forming a plurality of conductive terminal stud adhesion layers 166, a conductive terminal adhesion layer 169 is formed over the array of conductive terminal studs 160 and conductive terminal lines 122. Additionally, an array of pad adhesion layers 164 may be formed over a corresponding array of pads 110. FIG. 28A is a perspective view illustration of a display backplane 100 including conductive terminal studs prior to bonding the LEDs to the pads in accordance with an embodiment. FIG. 28B is a combination perspective view and cross-sectional side view illustration of a display backplane 100 including conductive terminal studs prior to bonding the LEDs to the pads in accordance with an embodiment. LEDs 150 may then be bonded to the backplane, a sidewall passivation layer 188 applied around the LEDs 150 and conductive terminal studs 160, and a top electrode layer 198 formed similarly as described above with regard to FIGS. 11A-13C.

In an embodiment, a backplane 100 includes an array of pads 110, a corresponding array of LEDs 150 bonded to the array of pads 110, an array of conductive terminal pads 120, and a corresponding array of conductive terminal studs 160 on the conductive terminal pads 120. A sidewall passivation layer 188 is formed around (e.g. surrounding) each of the LEDs 150 in the array of LEDs 150. A top electrode layer 198 is on and in electrical contact with the array of LEDs 150 and the array of conductive terminal studs 160. The sidewall passivation layer 188 may include a level top surface 190 around the array of LEDs 150. The sidewall passivation layer 188 may surround each of the LEDs 150 in the array of LEDs 150 and each of the conductive terminal studs 160 in the array of conductive terminal studs 160.

In an embodiment, a conductive terminal adhesion layer 169 is on the array of conductive terminal studs 160, and an array of pad adhesion layers 164 is on the array of pads 110. In such an arrangement, the sidewall passivation layer 188 may be in direct contact with the conductive terminal adhesion layer 169 on the array of conductive terminal studs 160.

In an embodiment, an array of conductive terminal lines 122 connect the array of conductive terminal pads 120, and a conductive terminal adhesion layer 169 is on the array of conductive terminal studs 160 and the array of conductive terminal lines 122 connecting the array of conductive terminal pads 120. In such an arrangement, the sidewall passivation layer 188 may be formed over the conductive terminal adhesion layer 169 that is formed on the array of conductive terminal lines 122.

In accordance with embodiments, an array of conductive terminal studs 160 without a well (W) structure reduces the amount of space required for integrating and functionalizing the LEDs 150. As a result, it may be possible to design higher resolution (higher PPI) backplanes, with LEDs 150 arranged more closely together. Omission of a well structure may additionally provide flexibility in the pixel design, so that a four subpixel arrangement is possible. For example, a red-green-blue-fourth color (e.g. green2, white, yellow, etc.) may be provided to create an enhanced color display pattern. Omission of the well structure may additional remove the processing operations associated with the formation and patterning of a bank layer, and allow for a thinner resist layer 180 to be utilized during the deposition of bonding layers 185 (e.g. see FIGS. 8B-8C), which may result in better control of the deposited bonding layer and profile of the openings 184.

Figure 29:
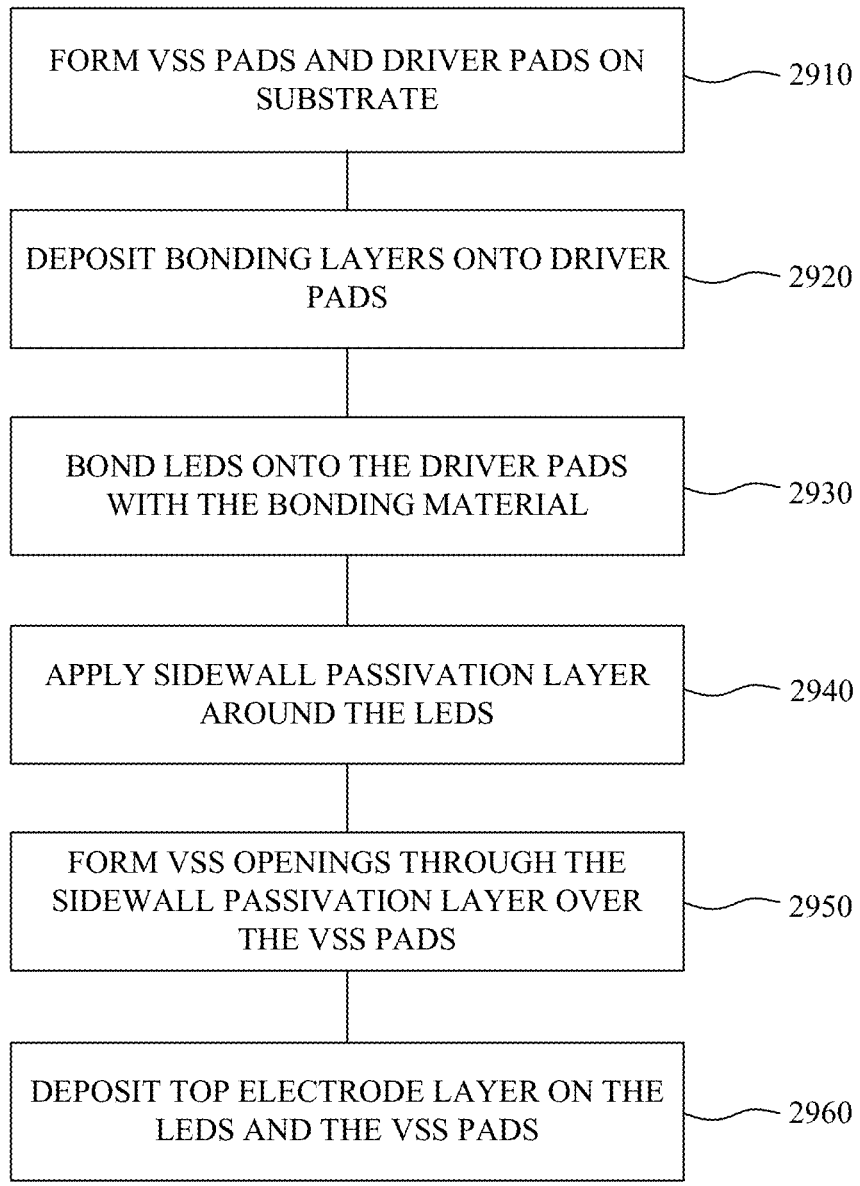
FIG. 29 is a flow chart illustrating a method of electrically connecting LEDs with conductive terminal pads beneath a sidewall passivation layer in accordance with an embodiment.

FIG. 29 is a flow chart illustrating a method of electrically connecting LEDs with a conductive terminal pad beneath a sidewall passivation layer in accordance with an embodiment. In interest of clarity, the following description of FIG. 29 is made with regard to reference features found in other figures described herein, particularly FIGS. 30-31.

At operation 2910 an array of conductive terminal pads 120 and an array of pads 110 are formed on a substrate. Bonding layers 185 may be deposited onto the pads 110 at operation 2920, followed by bonding an array of LEDs 150 to the array of pads 110 with the bonding layers 185 at operation 2930. At operation 2940 a sidewall passivation layer 188 is applied around the LEDs 150, and terminal openings 189 are formed through the sidewall passivation layer 188 over the conductive terminal pads 120 at operation 2950. A top electrode layer 198 is then deposited on the LEDs 150 and the conductive terminal pads 120 at operation 2960.

Figure 30:
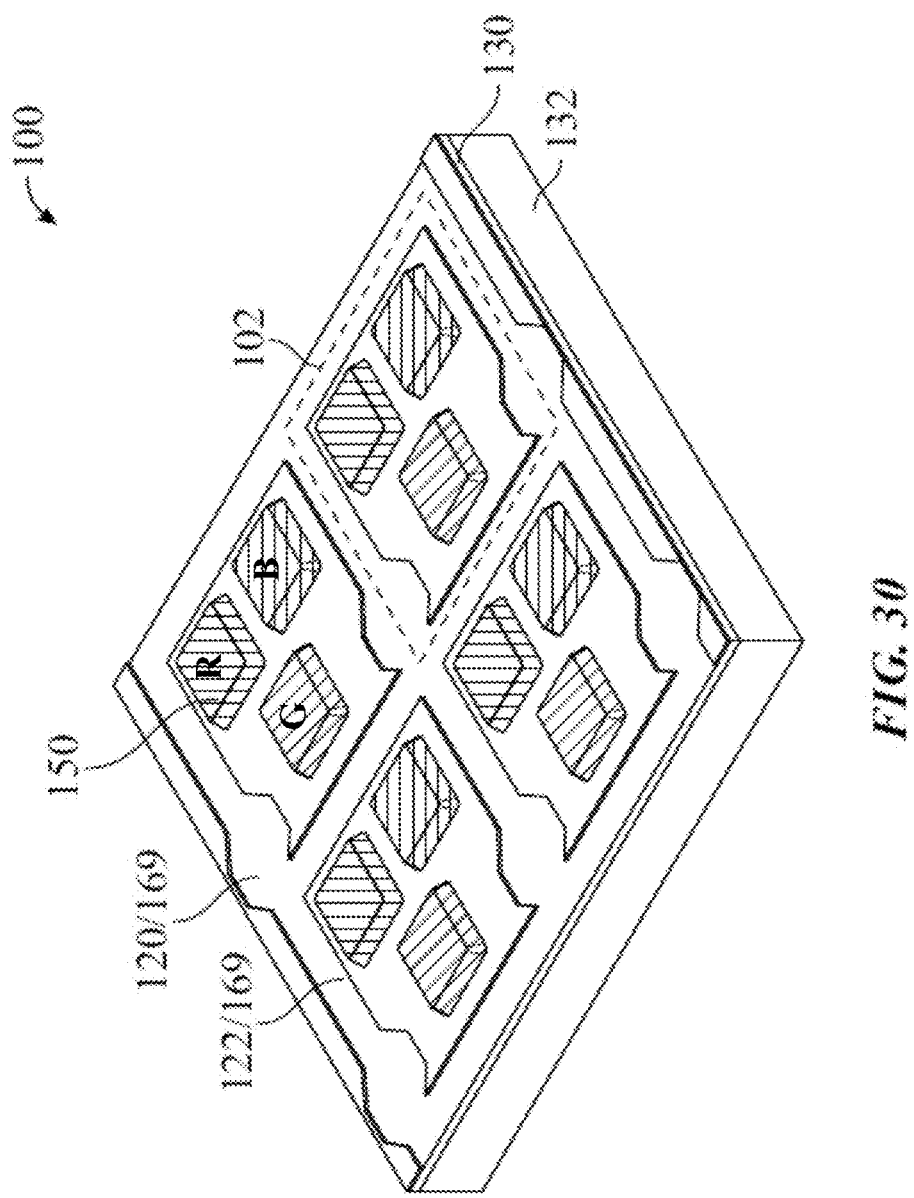
FIG. 30 is a perspective view illustration of LEDs bonded to a display substrate with exposed conductive terminal pads in accordance with an embodiment.

FIG. 30 is a perspective view illustration of LEDs 150 bonded to a display substrate with exposed conductive terminal pads in accordance with an embodiment. The particular arrangement of conductive terminal pads 120, conductive terminal lines 122, and pads illustrated in FIG. 30 may be substantially similar to the arrangement illustrated in FIGS. 23A-23C, and the pixel arrangements in either FIG. 22A or FIG. 22B. However, such an arrangement is exemplary and embodiments are not so limited. As shown in FIG. 30, the LEDs 150 may be bonded to the pads with a bonding layer as previously described. In an embodiment, the LEDs 150 are bonded to a planar surface of the build-up structure 130 including the pads 110, conductive terminal pads 120, and conductive terminal lines 122. In an embodiment, a patterned adhesion layer is formed prior to bonding the LEDs 150. For example, a patterned adhesion layer may include pad adhesion layers 164, and a conductive terminal adhesion layer 169 covering the conductive terminal pads 120 and optionally the conductive terminal lines 122.

Figure 31:
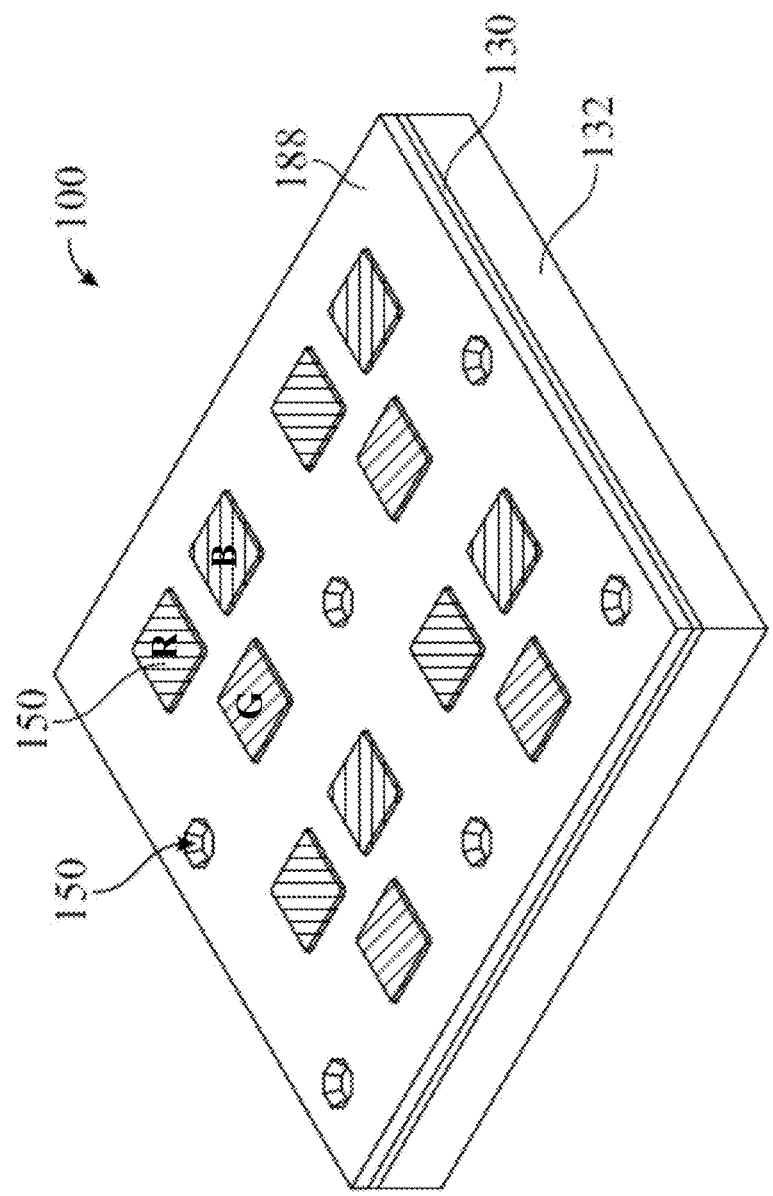
FIG. 31 is a perspective view illustration of a sidewall passivation layer formed around LEDs and vias through the sidewall passivation layer to expose conductive terminal pads in accordance with an embodiment.

FIG. 31 is a perspective view illustration of a sidewall passivation layer 188 formed around LEDs and terminal openings 189 through the sidewall passivation layer 188 over conductive terminal pads 120 in accordance with an embodiment. In an embodiment sidewall passivation layer 188 is formed, followed by etchback or planarization to expose the LEDs 150. Terminal openings 189 may then be formed over the conductive terminal pads 120. In an embodiment terminal openings 189 are vias. In an embodiments, terminal openings are trenches, and may be aligned over the conductive terminal lines 122. In the particular embodiment illustrated the terminal openings 189 and underlying conductive terminal pads 120 are arranged in a row including one LED 150 (e.g. Green) per pixel. Above is another row of LEDs including two LEDs 150 (e.g. Red, Blue) per pixel. In such an arrangement the terminal openings 189 and conductive terminal pads 120 may span across adjacent pixels for increased packing density, for higher resolution and PPI pixel arrangements.

In an embodiment, a backplane 100 includes an array of pads 110, a corresponding array of LEDs 150 bonded to the array of pads 110, and an array of conductive terminal pads 120. A sidewall passivation layer 188 is around (e.g. surrounding) each of the LEDs 150 in the array of LEDs 150. The sidewall passivation layer may include a level top surface 190 around the array of LEDs 150. An array of terminal openings 189 is formed in the sidewall passivation layer 188 over the array of conductive terminal pads 120. A top electrode layer 198 is then formed on and in electrical contact with the array of LEDs 150 and the array of conductive terminal pads 120. The backplane may additionally include an array of conductive terminal lines 122 connecting the array of conductive terminal pads 120, and the sidewall passivation layer is formed over the array of conductive terminal lines 122. In an embodiment, a conductive terminal adhesion layer 169 is formed on the array of conductive terminal pads 120 and the array of conductive terminal lines 122. In an embodiment, a conductive terminal pad 120 overlaps across two adjacent pixel areas.

In accordance with embodiments, an array of terminal openings 189 are formed though the sidewall passivation layer 188 to contact underlying conductive terminal routing. Elimination of a well (W) structure reduces the amount of space required for integrating and functionalizing the LEDs 150. As a result, it may be possible to design higher resolution (higher PPI) backplanes, with LEDs 150 arranged more closely together. Omission of a well structure and conductive terminal stud may additionally provide flexibility in the pixel design, so that a four subpixel arrangement is possible. For example, a red-green-blue-fourth color (e.g. green2, white, yellow, etc.) may be provided to create an enhanced color display pattern. Omission of the well structure and conductive terminal stud may additional remove the processing operations associated with the formation and patterning of a bank layer, and allow for a thinner resist layer 180 to be utilized during the deposition of bonding layers 185 (e.g. see FIGS. 8B-8C), which may result in better control of the deposited bonding layer and profile of the openings 184.

Figure 32:
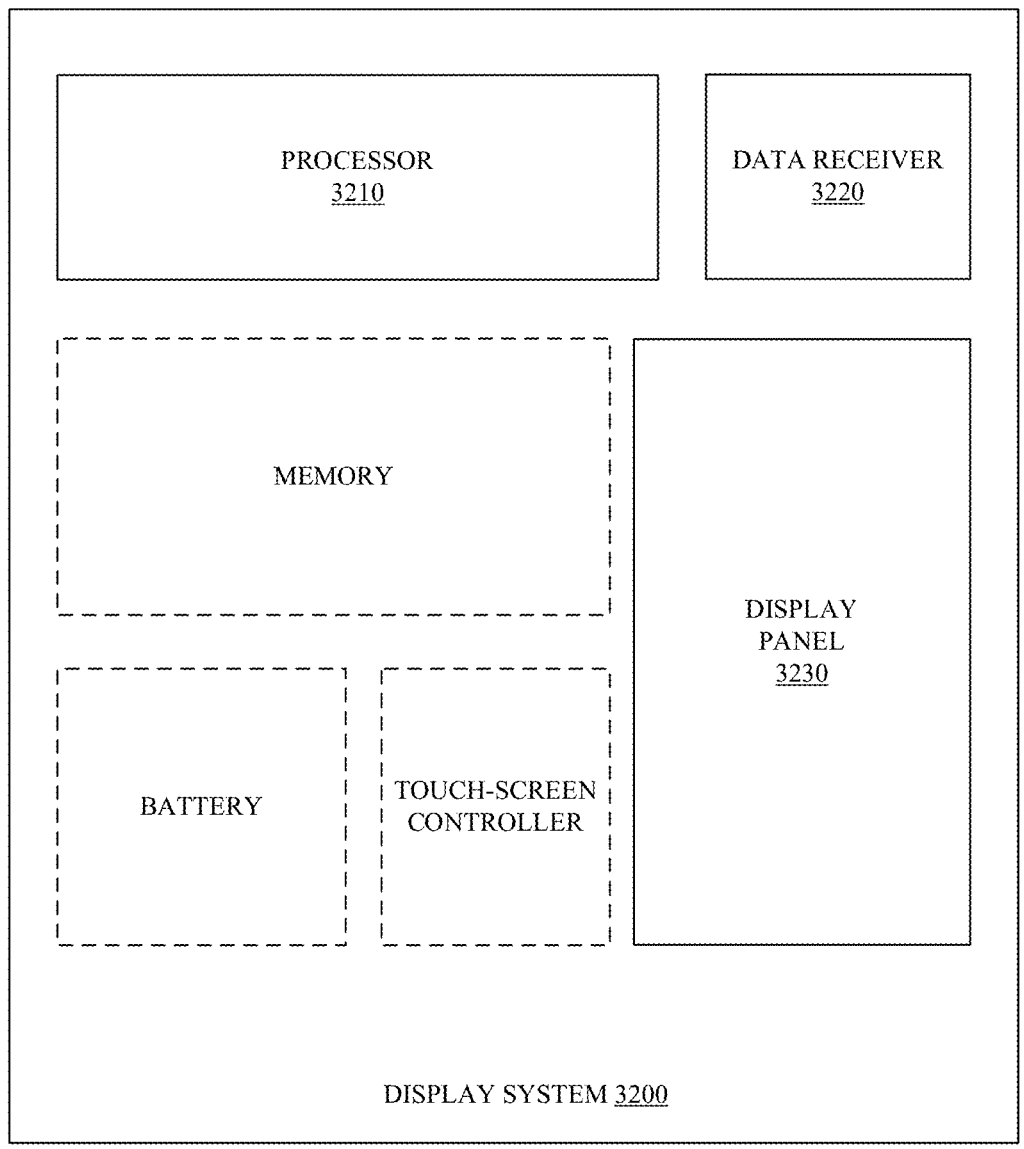
FIG. 32 is a schematic illustration of a display system in accordance with an embodiment.

FIG. 32 illustrates a display system 3200 in accordance with an embodiment. The display system houses a processor 3210, data receiver 3220, and one or more display panels 3230 which may include a display backplane 100. The display panels 3230 may additionally include one or more display driver ICs such as scan driver ICs and data driver ICs. The data receiver 3220 may be configured to receive data wirelessly or wired. Wireless may be implemented in any of a number of wireless standards or protocols.

Depending on its applications, the display system 3200 may include other components. These other components include, but are not limited to, memory, a touch-screen controller, and a battery. In various implementations, the display system 3200 may be a wearable device (e.g. watch), television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for integrating and electrically connecting LEDs on a backplane. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display comprising:
   an array of pads, and a corresponding array of light emitting diodes (LEDs) bonded to the array of pads;
   an array of conductive terminal well structures, each conductive terminal well structure including conductive terminal sidewalls that surround at least one LED;
   a sidewall passivation layer around each of the LEDs in the array of LEDs and contained within the conductive terminal well structures; and
   an electrode layer on and in direct electrical contact with the array of LEDs and the array of conductive terminal sidewalls.

2. The display of claim 1, further comprising a passivation layer including a first array of openings over the array of pads and a second array of openings over an array of conductive terminal pads.

3. The display of claim 2, wherein the conductive terminal sidewalls connect adjacent conductive terminal pads and span over the passivation layer.

4. The display of claim 3, further comprising a conductive terminal sidewall adhesion layer on the conductive terminal sidewalls and an array of pad adhesion layers on the array of pads, wherein the array of pad adhesion layers are electrically insulated from the conductive terminal sidewall adhesion layer.

5. The display of claim 4, wherein the sidewall passivation layer is in direct contact with the conductive terminal sidewall adhesion layer on the conductive terminal sidewalls.

6. The display of claim 4, wherein the conductive terminal sidewall adhesion layer and the array of pad adhesion layers comprise tantalum nitride.

7. The display of claim 1, wherein conductive terminal sidewalls are shared between adjacent conductive terminal wells.

8. The display of claim 1, wherein each conductive terminal well structure includes conductive terminal sidewalls surrounding a single subpixel.

9. The display of claim 8, wherein each subpixel includes a pair of independently addressable pads, and a corresponding pair of LEDs.

10. The display of claim 1, wherein the sidewall passivation layer includes a level top surface within the array of conductive terminal well structures.

11. A display comprising:
    an array of pads;
    an array of conductive terminal pads, and a corresponding array of conductive terminal studs on the conductive terminal pads;
    a conductive terminal adhesion layer on the array of conductive terminal studs and an array of pad adhesion layers on the array of pads;
    a corresponding array of LEDs bonded to the array of pad adhesion layers on the array of pads;
    a sidewall passivation layer around each of the LEDs in the array of LEDs;
    an electrode layer on and in direct electrical contact with the array of LEDs and the array of conductive terminal studs.

12. The display of claim 11, wherein the sidewall passivation layer includes a level top surface around the array of LEDs.

13. The display of claim 11, further comprising a bank layer including an array of bank openings over the array of pads, and an array of terminal stud openings over the array of conductive terminal studs; wherein the electrode layer is formed over the bank layer, and the sidewall passivation layer is contained within the array of bank openings.

14. The display of claim 13, wherein sidewalls of each bank opening surround one corresponding subpixel.

15. The display of claim 11, wherein the sidewall passivation layer surrounds each of the conductive terminal studs in the array of conductive terminal studs.

16. The display of claim 15:
    wherein the sidewall passivation layer is in direct contact with the conductive terminal adhesion layer on the array of conductive terminal studs.

17. The display of claim 11 further comprising:
    an array of conductive terminal lines connecting the array of conductive terminal pads;
    wherein the conductive terminal adhesion layer is on the array of conductive terminal lines connecting the array of conductive terminal pads; and
    wherein the sidewall passivation layer is formed over the conductive terminal adhesion layer that is formed on the array of conductive terminal lines.

18. A display comprising:
    an array of pads;
    an array of conductive terminal pads;
    a conductive terminal adhesion layer on the array of conductive terminal pads and an array of pad adhesion layers on the array of pads;
    a corresponding array of LEDs bonded to the array of conductive terminal pads on the array of pads;
    a sidewall passivation layer around each of the LEDs in the array of LEDs;
    an array of openings in the sidewall passivation layer over the array of conductive terminal pads; and
    an electrode layer on and in direct electrical contact with the array of LEDs and the array of conductive terminal pads.

19. The display of claim 18, further comprising an array of conductive terminal lines connecting the array of conductive terminal pads, and the sidewall passivation layer is formed over the array of conductive terminal lines.

20. The display of claim 19, wherein the conductive terminal adhesion layer is on the array of conductive terminal lines.

21. The display of claim 19, wherein each conductive terminal pad overlaps across two adjacent pixel areas.

22. The display of claim 18, wherein the sidewall passivation layer includes a level top surface around the array of LEDs.

* * * * *